US012381441B2

(12) United States Patent
Crosson

(10) Patent No.: US 12,381,441 B2
(45) Date of Patent: Aug. 5, 2025

(54) ELECTRIC MACHINE ASSEMBLY HAVING END FRAME COOLING

(71) Applicant: REGAL BELOIT AMERICA, INC., Beloit, WI (US)

(72) Inventor: Jeffrey William Crosson, Dayton, OH (US)

(73) Assignee: Regal Beloit America, Inc., Milwaukee, WI (US)

( * ) Notice: Subject to any disclaimer, the term of this patent is extended or adjusted under 35 U.S.C. 154(b) by 258 days.

(21) Appl. No.: 17/679,967

(22) Filed: Feb. 24, 2022

(65) Prior Publication Data

US 2022/0271604 A1 Aug. 25, 2022

Related U.S. Application Data

(60) Provisional application No. 63/153,660, filed on Feb. 25, 2021.

(51) Int. Cl.

*H02K 5/18* (2006.01)
*H02K 5/10* (2006.01)
*H02K 5/15* (2006.01)
*H02K 5/22* (2006.01)
*H02K 9/06* (2006.01)
*H02K 9/22* (2006.01)
*H02G 11/00* (2006.01)
*H02K 3/52* (2006.01)
*H02K 15/02* (2006.01)
*H05K 7/14* (2006.01)

(52) U.S. Cl.

CPC ............... *H02K 5/225* (2013.01); *H02K 5/10* (2013.01); *H02K 5/15* (2013.01); *H02K 5/18* (2013.01); *H02K 9/06* (2013.01); *H02K 9/227* (2021.01); *H02G 11/00* (2013.01); *H02K 3/522* (2013.01); *H02K 15/02* (2013.01); *H02K 2203/06* (2013.01); *H02K 2205/09* (2013.01); *H05K 7/1491* (2013.01)

(58) Field of Classification Search

CPC ............ H02K 5/225; H02K 5/10; H02K 5/15; H02K 5/18; H02K 9/227; H02K 9/06

USPC ................................................ 310/52, 62–64

See application file for complete search history.

(56) References Cited

U.S. PATENT DOCUMENTS 2,514,875 A 7/1950 Kollsman
2,889,072 A 6/1959 Lapham
4,134,291 A 1/1979 Gregoire
4,689,507 A 8/1987 Baker et al.
4,882,510 A 11/1989 Newberg (Continued)

FOREIGN PATENT DOCUMENTS

CN 1427410 A 7/2003
CN 204538932 U 8/2015

(Continued)

*Primary Examiner* — Michael Andrews

(74) *Attorney, Agent, or Firm* — Armstrong Teasdale LLP

(57) ABSTRACT

An electric machine assembly includes a shaft configured to rotate about an axis and an end frame coupled about the shaft such that the shaft rotates relative to the end frame. The end frame includes an end surface and a plurality of pins that extend axially from the end surface. The electric machine assembly also includes a fan coupled to the shaft such that rotation of the shaft causes rotation of the fan to facilitate cooling the plurality of pins.

20 Claims, 27 Drawing Sheets

(56) References Cited

U.S. PATENT DOCUMENTS 4,904,891 A * 2/1990 Baker .................. F04D 29/281 310/63
5,085,443 A 2/1992 Richards
5,223,671 A 6/1993 Alfieri
5,519,273 A 5/1996 Keck
6,828,704 B2 12/2004 Okamoto et al.
7,071,587 B2 7/2006 Lopatinsky et al.
7,140,760 B2 11/2006 Kidd
7,211,914 B2 5/2007 Hofmann et al.
7,310,961 B2 12/2007 Hoshi et al.
7,488,096 B2 2/2009 Childers et al.
7,770,630 B2 8/2010 Chesser et al.
7,781,926 B2 8/2010 Schmidt
7,977,831 B2 7/2011 De Filippis
8,912,695 B2 12/2014 Hashish
9,413,208 B2 8/2016 Pal
9,577,489 B2 2/2017 Collins
10,177,631 B1 1/2019 Hopkins et al.
10,284,047 B2 5/2019 Fritts
10,833,552 B2 11/2020 Major et al.
11,658,545 B2 5/2023 Alanis et al.
2002/0117919 A1 8/2002 Williams et al.
2002/0141888 A1* 10/2002 Bostwick ................ H02K 9/06 417/366
2004/0092134 A1 5/2004 Morikaku et al.
2005/0127675 A1 6/2005 Kirkpatrick et al.
2006/0257251 A1* 11/2006 Carlson ................ F04D 29/544 415/178
2007/0261929 A1 11/2007 Hsu et al.
2008/0053021 A1 3/2008 Munoz
2009/0267432 A1 10/2009 Henry et al.
2012/0045353 A1 2/2012 Watanabe et al.
2014/0306559 A1* 10/2014 Stillger .................... H02K 9/14 310/59
2014/0332194 A1* 11/2014 Durland ............... H02K 49/046 29/598
2015/0130386 A1 5/2015 Zumstein
2016/0204676 A1 7/2016 Ziegler et al.
2016/0329760 A1 11/2016 Major
2017/0012504 A1* 1/2017 Sever ..................... H02K 15/14
2017/0264171 A1 9/2017 Williams
2017/0288486 A1 10/2017 Hoemann
2018/0309343 A1 10/2018 Tolksdorf
2019/0348892 A1* 11/2019 Aso ........................ H02K 21/16
2020/0161925 A1 5/2020 Maruyama et al.
2020/0177058 A1 6/2020 Goto
2020/0350801 A1 11/2020 Takahashi et al.
2020/0373867 A1 11/2020 Yamashita et al.
2021/0234423 A1* 7/2021 Leonardi ................ B60K 11/02
2021/0344253 A1 11/2021 Eason

FOREIGN PATENT DOCUMENTS

CN 106357043 A 1/2017
CN 207705958 U 8/2018
CN 211377789 U 8/2020
DE 102004031399 B4 2/2006
DE 102015013337 A1 4/2017
DE 202019103563 U1 8/2019
EP 0731627 A1 9/1996
EP 0854560 A1 7/1998
EP 1237260 A2 9/2002
EP 1557928 A1 7/2005
EP 1722462 A1 11/2006
EP 3007334 A2 4/2016
EP 3301790 A2 4/2018
EP 3719972 A1 10/2020
GB 2131630 A 6/1984
JP S51148557 U 11/1976
JP S5893447 A 6/1983
JP S61266047 A 11/1986
JP 2001028858 A 1/2001
JP 2007082362 A 3/2007
JP 6797335 B1 12/2020
WO 2012123603 A1 9/2012
WO 2016155933 A1 10/2016
WO 2021007628 A1 1/2021

* cited by examiner 150
148
152

154
138
150
146

ELECTRIC MACHINE ASSEMBLY HAVING END FRAME COOLING

This application claims priority to U.S. Provisional Application No. 63/153,660, filed Feb. 25, 2021, which is hereby incorporated by reference in its entirety.

BACKGROUND

The field of the invention relates generally to electrical machine assemblies and, more particularly, to cooling electrical components of electric machine assemblies.

At least some known electric machine assemblies include various components that generate heat during operation and include fans for cooling those components. Specifically, such electric machine assemblies may include an end frame along with a fan at an end of the assembly, wherein the fan rotates with the shaft to provide a cooling flow. However, the cooling flow typically is channeled only along the exterior of the assembly housing to provide the cooling airflow to components downstream of the end frame. Additionally, at least some known end frames are designed to channel any cooling airflow they do receive radially outward toward the housing. Such a configuration does not provide sufficient airflow to cool the end frame and any components that are within the housing immediately downstream of the end frame.

BRIEF DESCRIPTION

An electric machine assembly is provided. The electric machine assembly includes a shaft configured to rotate about an axis and an end frame coupled about the shaft such that the shaft rotates relative to the end frame. The end frame includes an end surface and a plurality of pins that extend axially from the end surface. The electric machine assembly also includes a fan coupled to the shaft such that rotation of the shaft causes rotation of the fan to facilitate cooling the plurality of pins.

An end frame for an electric machine assembly is provided. The end frame includes an end surface and a plurality of pins that extend axially from the end surface. The plurality of pins are arranged in a plurality of concentric circles, and wherein each circle of pins is circumferentially offset from an immediately adjacent circle of pins.

A method of manufacturing an end frame for use with an electric machine assembly is provided. The method includes forming an end surface and forming a plurality of pins that extend axially from the end surface. The plurality of pins are arranged in a plurality of concentric circles, and wherein each circle of pins is circumferentially offset from an immediately adjacent circle of pins.

DETAILED DESCRIPTION

Figure 1:
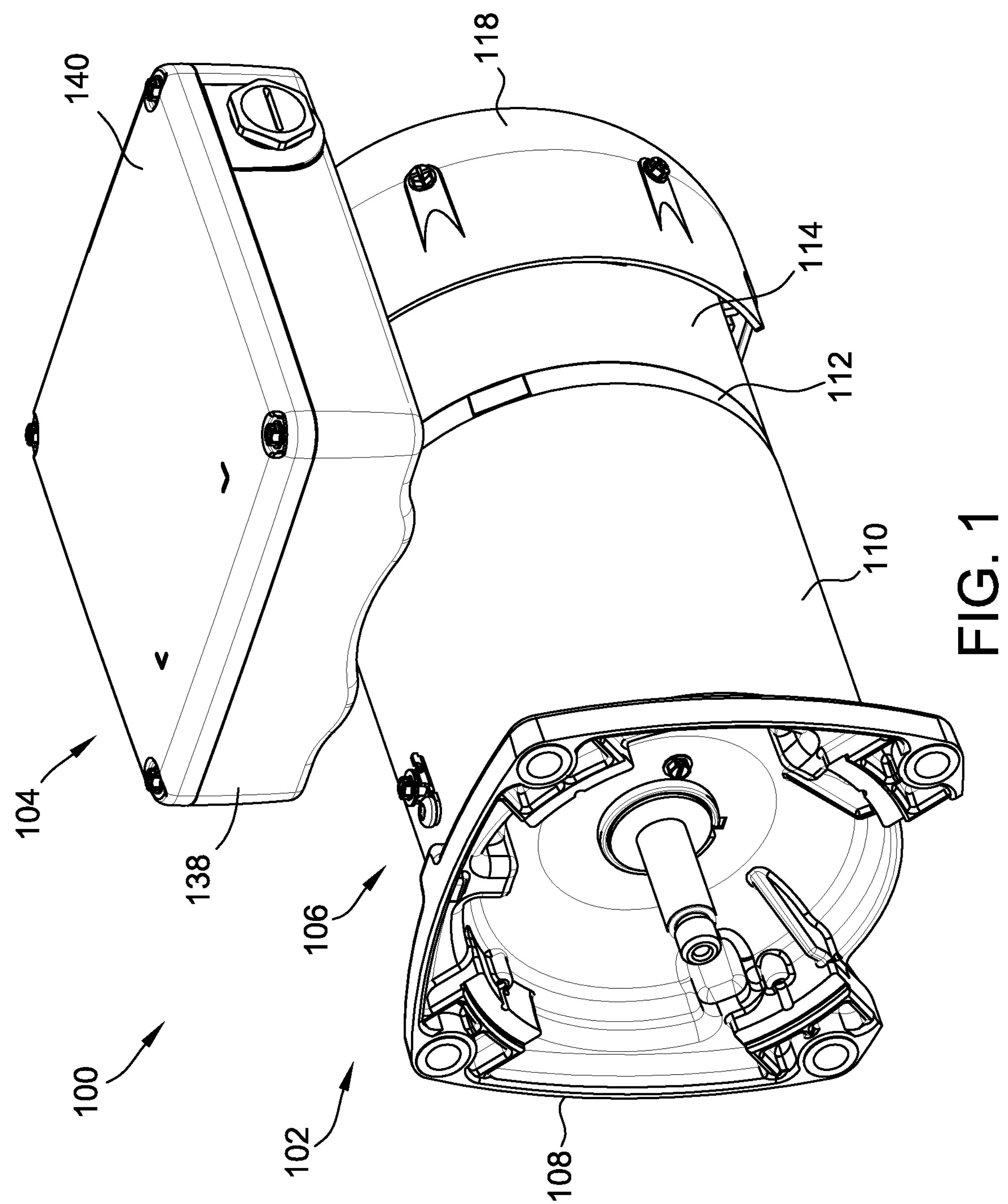
FIG. 1 is a perspective view of an exemplary electric machine assembly.
Figure 2:
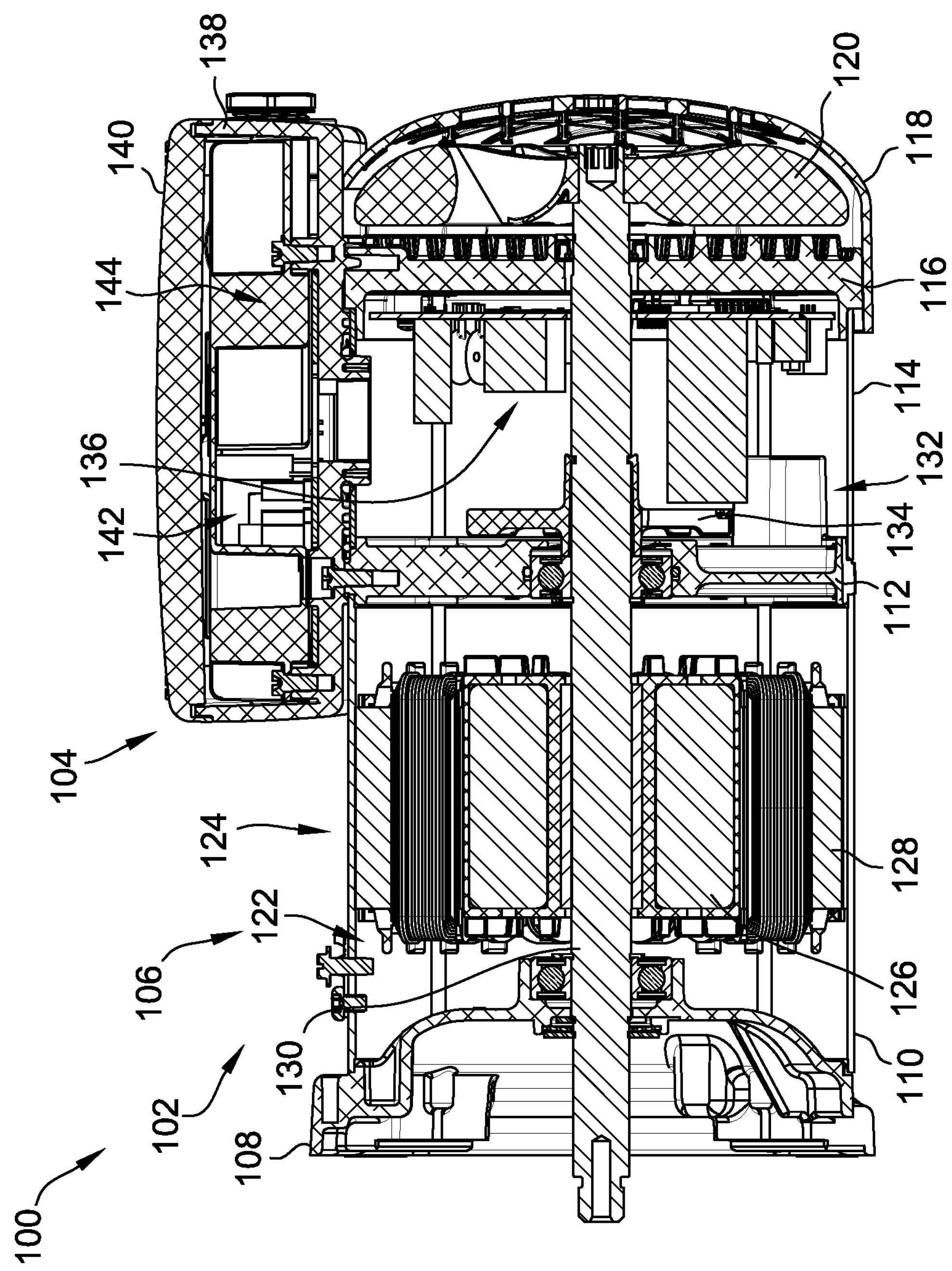
FIG. 2 is a cross-sectional view of the electric machine assembly shown in FIG. 1.
Figure 3:
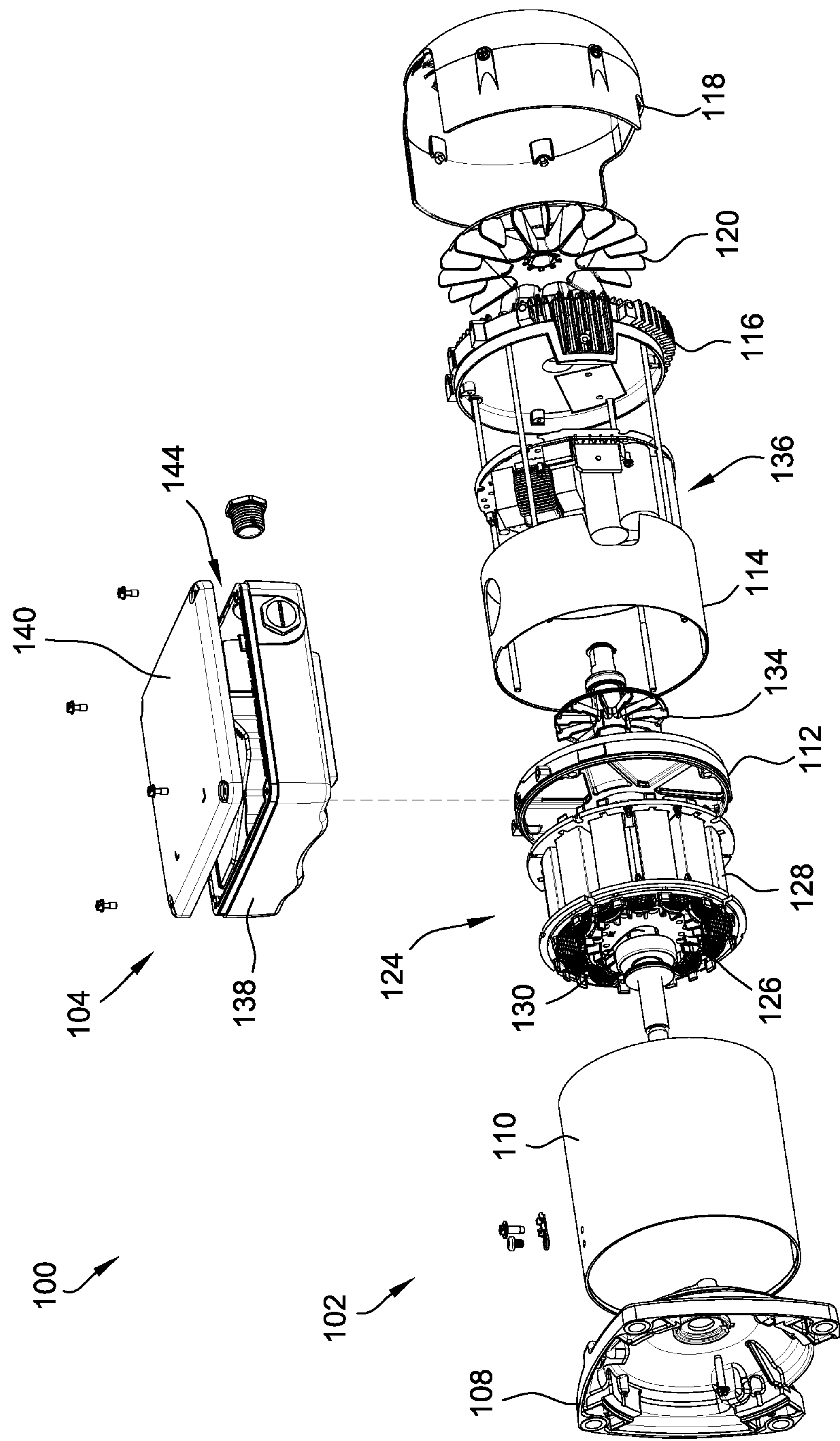
FIG. 3 is a partially exploded view of the electric machine assembly shown in FIG. 1.

FIG. 1 is a perspective view of an exemplary electric machine assembly 100; FIG. 2 is a cross-sectional view of electric machine assembly 100; and FIG. 3 is a partially exploded view of electric machine assembly 100.

In the exemplary embodiment, electrical machine assembly 100 includes a motor assembly 100 coupled to a terminal box 104. In some embodiments, the terminal box 104 is removably coupled to the housing 106. In some embodiments, the housing 106 comprises a first plurality of housing openings and a second plurality of housing openings. Motor assembly 100 includes a housing 106 that includes a mounting bracket 108, a first housing portion 110 coupled to mounting bracket 108, a mid-frame 112 coupled to first housing portion 110, a second housing portion 114 coupled to mid-frame 112 opposite first housing portion 110, an end frame 116 coupled to second housing portion 114, and a shroud 118 coupled to second housing portion 114. The housing 106 defines an inner cavity. The mid-frame 112 is configured to separate the inner cavity of the housing 106 into a first compartment 122 and a second compartment 132. The mid-frame 112 is coupled between first portion 110 of the housing 106 and second portion 114 of the housing 106 such that the mid-frame 112 and the first portion 110 combine to the at least partially define the first compartment 122 and such that the mid-frame 112 and the second portion 114 combine to at least partially define the second compartment 132. A fan 120 is positioned axially between end frame 116 and shroud 118 and configured to generate a cooling airflow channeled by shroud 118 along an exterior of housing 106. In some embodiments, the housing 106 includes a first plurality of housing openings and a second plurality of housing openings, in some embodiments, the first plurality of housing openings are mid-frame openings 224, and the second plurality of housing openings are end frame openings 226.

Mounting bracket 108, mid-frame 112, and first housing portion 110 combine to define the first compartment 122 that houses a motor 124 therein. In the exemplary embodiment, motor 124 includes a rotor 126 and a stator 128 circumscribing rotor 126. A shaft 130 of motor 124 extends axially through concentric openings in mounting bracket 108, rotor 126, mid-frame 112, end frame 116, and is coupled to fan 120. In some embodiments, the stator 128 is positioned within the first compartment 122.

Similarly, mid-frame 112, end frame 116, and second housing portion 114 combine to define the second compartment 132 that houses an internal fan 134 and a plurality of electric drive components 136. Fan 134 is positioned proximate to mid-frame 112 and is coupled to shaft 130 to rotate therewith. Drive components 136 are positioned adjacent end frame 116 and are stationary within second compartment 132. In some embodiments, the end frame 116 at least partially defines the second compartment 132 opposite the mid-frame 112.

As shown in FIGS. 1-3, terminal box 104 includes a base 138 coupled to the housing 106 and a lid 140 removably coupled to base 138. Base 138 and lid 140 define an internal compartment 142 that houses a plurality of electrical control components 144 therein.

In some embodiments, the plurality of electrical components 136 are positioned with the second compartment 132, and the stator 128 and the second plurality of electrical components 136 are electrically coupled by a first plurality of wires extending through the mid-frame 112. In some embodiments, the plurality of electrical components 144 within the terminal box 104 are electrically coupled to the plurality of electrical components 136 within the second compartment 132 by a second plurality of wires extending through the second compartment 132 and into the terminal box 104.

Figure 4:
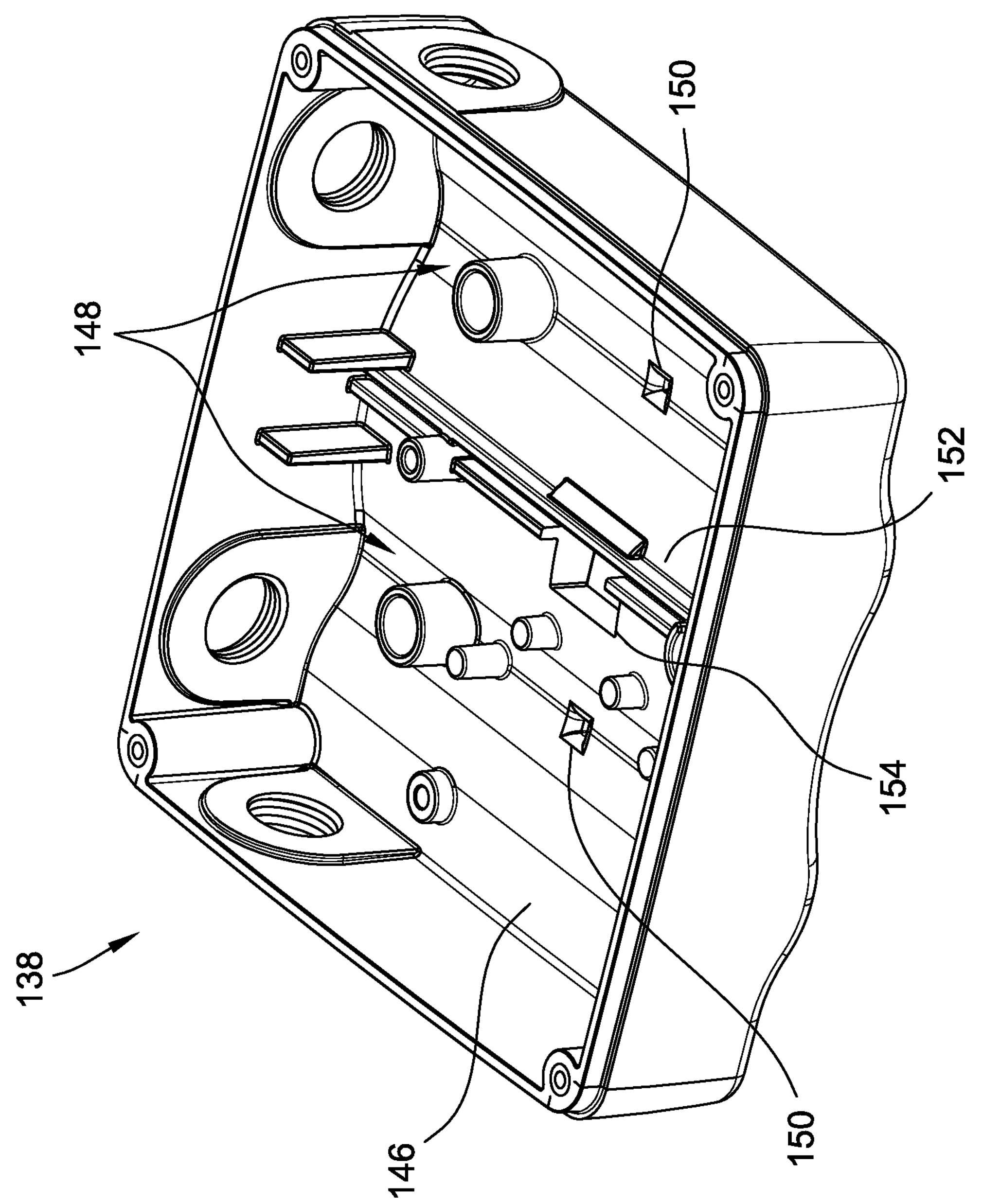
FIG. 4 is a perspective view of a base of a terminal box that may be used with the electrical machine assembly of FIG. 1.
Figure 5:
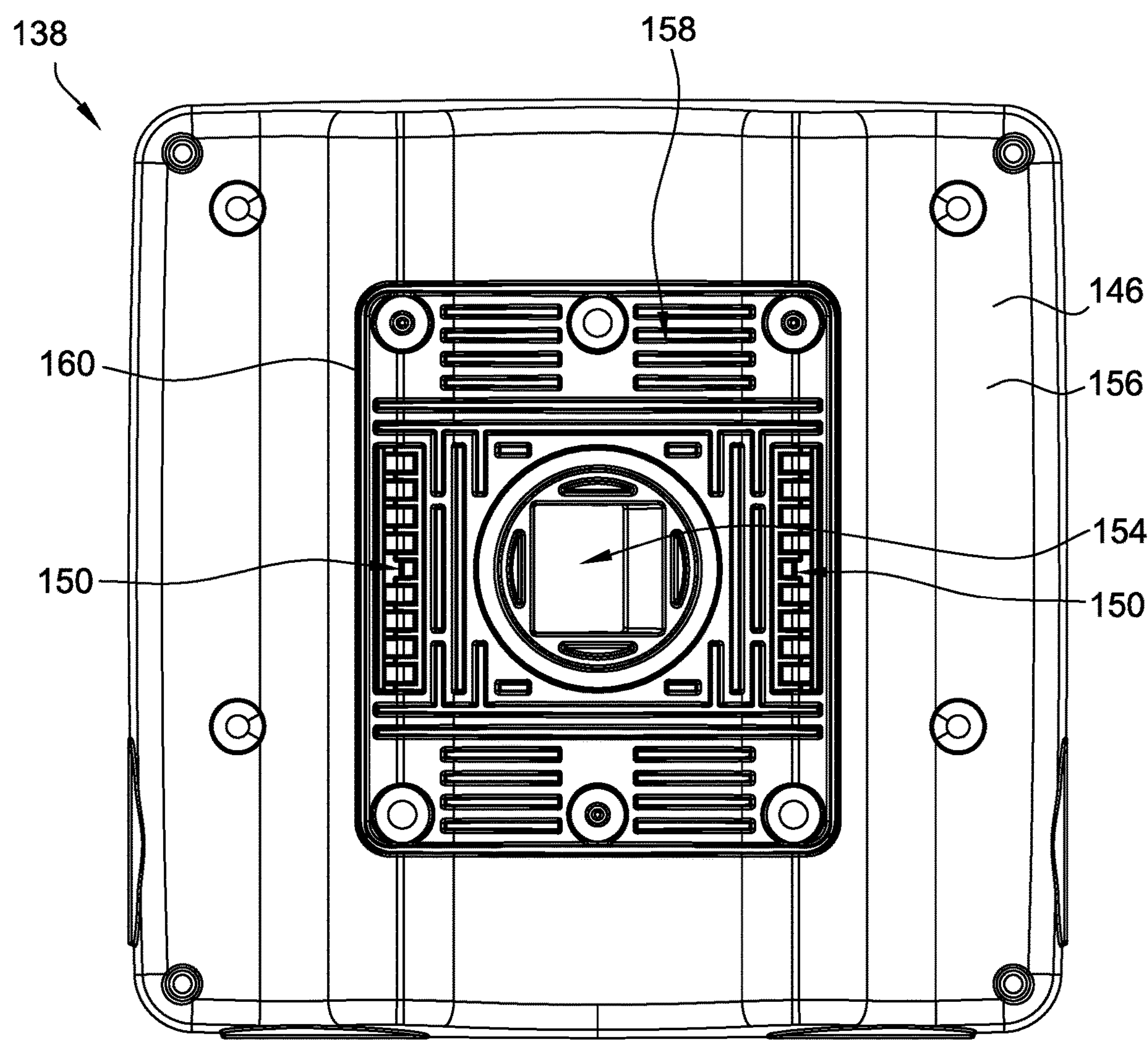
FIG. 5 is a bottom view of the terminal box base portion shown in FIG. 4.
Figures 6, 7:
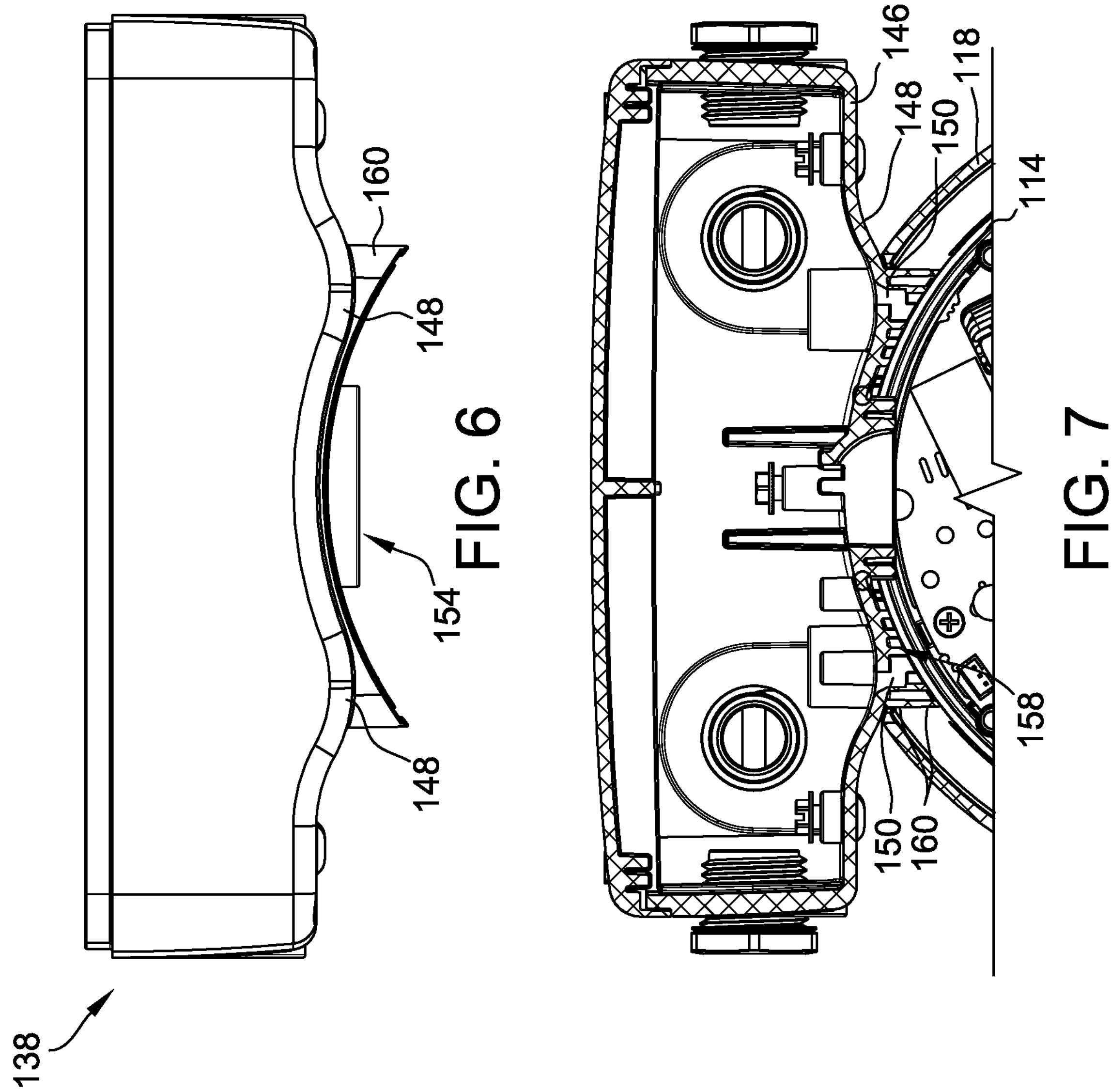
FIG. 6 is a side view of the terminal box base portion shown in FIG. 4.
FIG. 7 is cross-sectional view of the terminal box base portion shown in FIG. 4.
Figure 8:
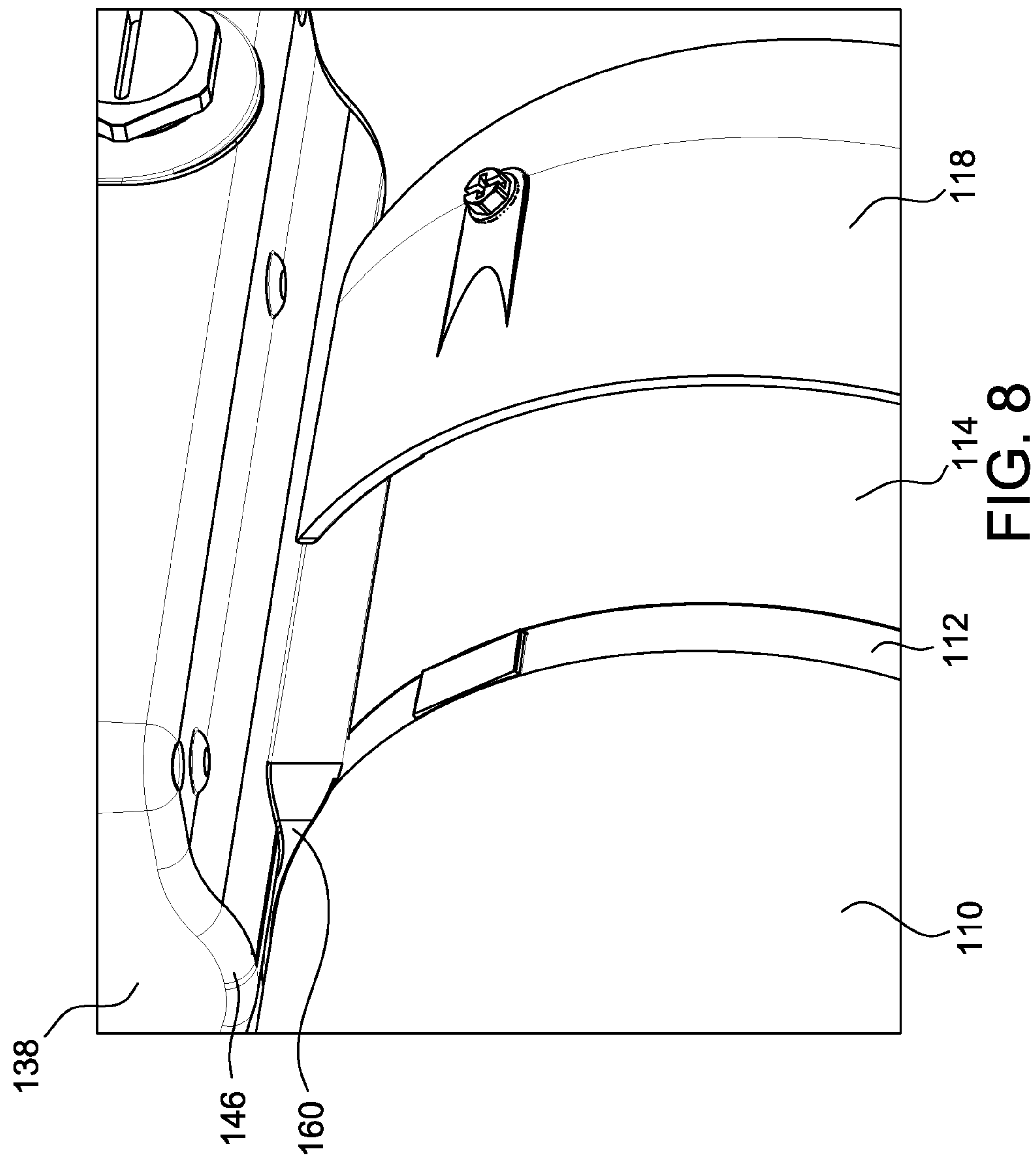
FIG. 8 is a perspective view of the terminal box mating with a housing of the electrical machine assembly of FIG. 1.

FIG. 4 is a perspective view of base 138 of terminal box 104; FIG. 5 is a bottom view of base 138; FIG. 6 is a side view of base 138; FIG. 7 is cross-sectional view of base 138; and FIG. 8 is a perspective view of terminal box 104 mating with housing 106. In the exemplary embodiment, the terminal box 104 comprises a base 138 having an outer wall 160 extending therefrom. The base 138 of the terminal box 104 includes a bottom wall 146 that includes a wave shape to define a pair of troughs 148 extending the complete axial length of bottom wall 146 and a rise portion 152 defined between the pair of troughs 148. Each trough 148 includes a drainage opening 150 defined through bottom wall 146. In the exemplary embodiment, troughs 148 are sloped on axial sides of openings 150 such that condensate formed within internal compartment 144 of terminal box 104 is channeled along troughs 148 and discharged from compartment 142 through openings 150. Furthermore, drainage openings 150 are oriented in a direction that prevents or limits ingress of moisture therethrough. In some embodiments, drainage opening 150 are oriented with respect to the trough 148 to restrict moisture ingress. In some embodiments, the rise portion 152 and the pair of troughs 148 extend a complete axial length of the bottom wall 146.

The rise portion 152 is defined between troughs 148 and includes a central opening 154 that allows for wiring to extend therethrough to drive components 136 within second housing portion 132. Because opening 154 is positioned above troughs 148, moisture from within terminal box 104 cannot travel from terminal box 104 into housing 106. In some embodiments, the rise portion 152 extends a complete axial length of the bottom wall 146. In some embodiments, the central opening 154 is radially spaced from the drainage openings 150 to restrict moisture ingress through the central opening 154. In some embodiments, the central opening 154 is configured to receive a plurality of wires therethrough.

As shown in FIGS. 5-7, bottom wall 146 includes an exterior surface 156 from which a plurality of inner walls 158 and an outer wall 160 extend. Specifically, outer wall 160 extends about the perimeter of inner walls 158 and forms a partial seal between terminal box 104 and housing 106. Specifically, the outer wall 160 forms a perimeter about the plurality of inner walls 158 and the drainage openings 150. In some embodiments, the outer wall 160 comprises a distal edge that is correspondingly shaped with the housing 106 such that the outer wall 160 engages with the housing 106 and with the shroud 118 to form a seal. In some embodiments, the shroud 118 comprises a cutout portion defined by an inner edge that corresponds in shape to the base 138 such that the cutout portion is configured to receive the base 138, and wherein the inner edge is configured to engage the outer wall 160. In some embodiments, the outer wall 160 extends entirely around the plurality of inner walls 158 to form a boundary.

Inner walls 158 include walls with varying lengths, heights, and orientations configured to slow down and block moisture from entering drainage openings 150. Furthermore, inner walls 158 have gaps between adjacent walls that allow moisture to flow to the lowest point and drip from terminal box 104. Specifically, at least outer wall 160 axially overhangs end frame 116 and facilitates draining by allowing moisture to drip onto end frame 116. In some embodiments, the outer wall 160 at least partially axially overhangs the end frame 116 such that moisture contained by the outer wall 160 is channeled to the end frame 116.

As shown in FIGS. 7 and 8, outer wall 160 forms a seal between terminal box 104 and housing 106 that prevents ingress of moisture into terminal box 104 through openings 150 and 154. Specifically, outer wall 160 engages with second portion 114 of housing 106 and with mid-frame 112 to block moisture from impacting housing 106 and bouncing upward into terminal box 104. Furthermore, shroud 118 includes a cutout portion that receives terminal box 104 such that the edge of the cutout portion engages terminal box near the junction of outer wall 160 and bottom surface 156.

In some embodiments, the plurality of inner walls 158 comprise a first subset **158*a* of inner walls 158 having a first length, a first height, and a first orientation and a second subset 158*b* of inner walls 158 having a second length, a second height, and a second orientation. In some embodiments, the first height is different than the second height, the first length is different from the second length, and the first orientation is different from the second orientation. In some embodiments, the first subset 158***a* and the second subset 158*b* of inner walls 158 are configured to channel moisture away from the at least one drainage opening.

Figure 9:
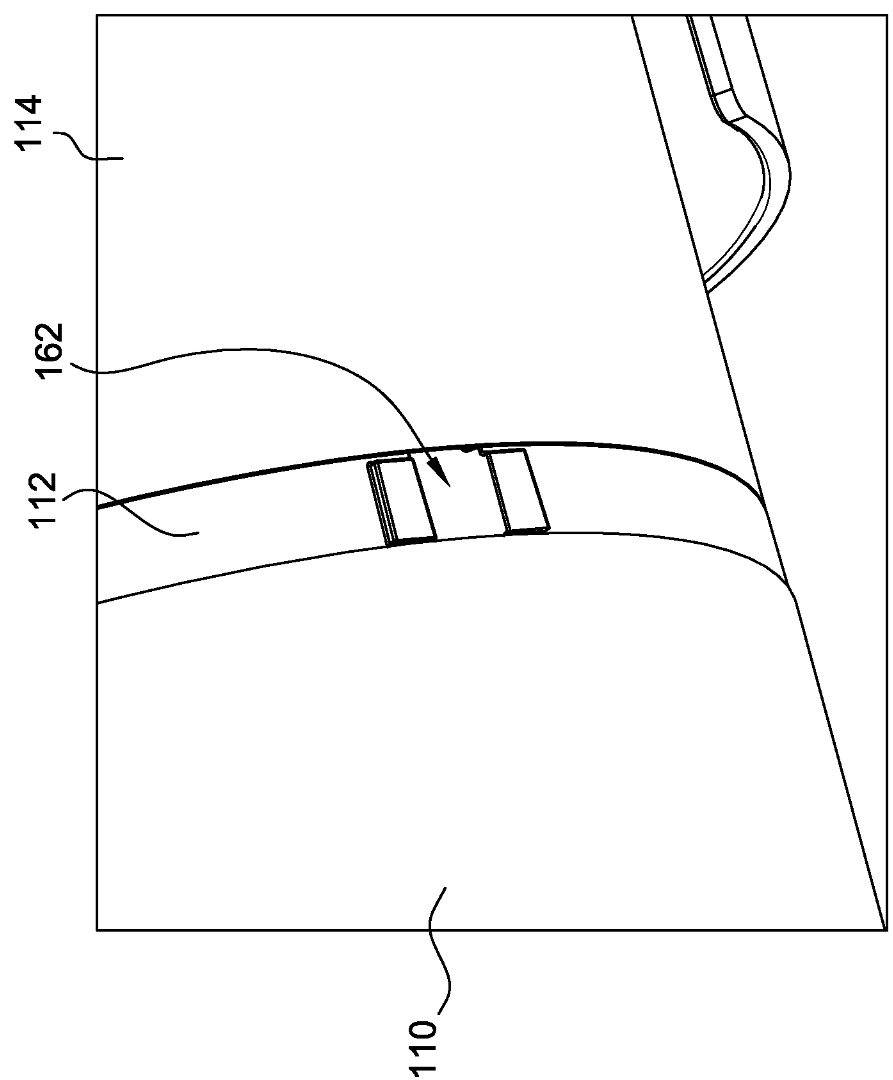
FIG. 9 is a bottom view of a drain formed in a housing of the electrical machine assembly shown in FIG. 1.
Figure 10:
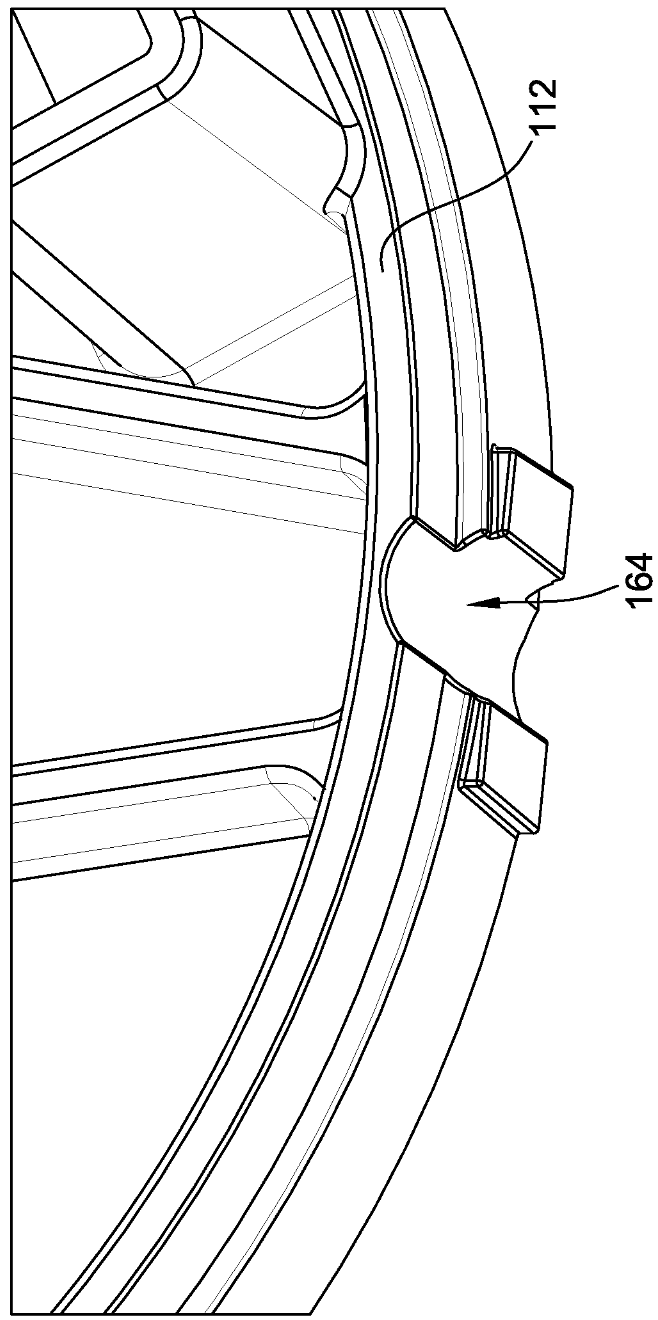
FIG. 10 is a perspective view of a portion of a mid-frame for use with the electrical machine assembly shown in FIG. 1
Figure 11:
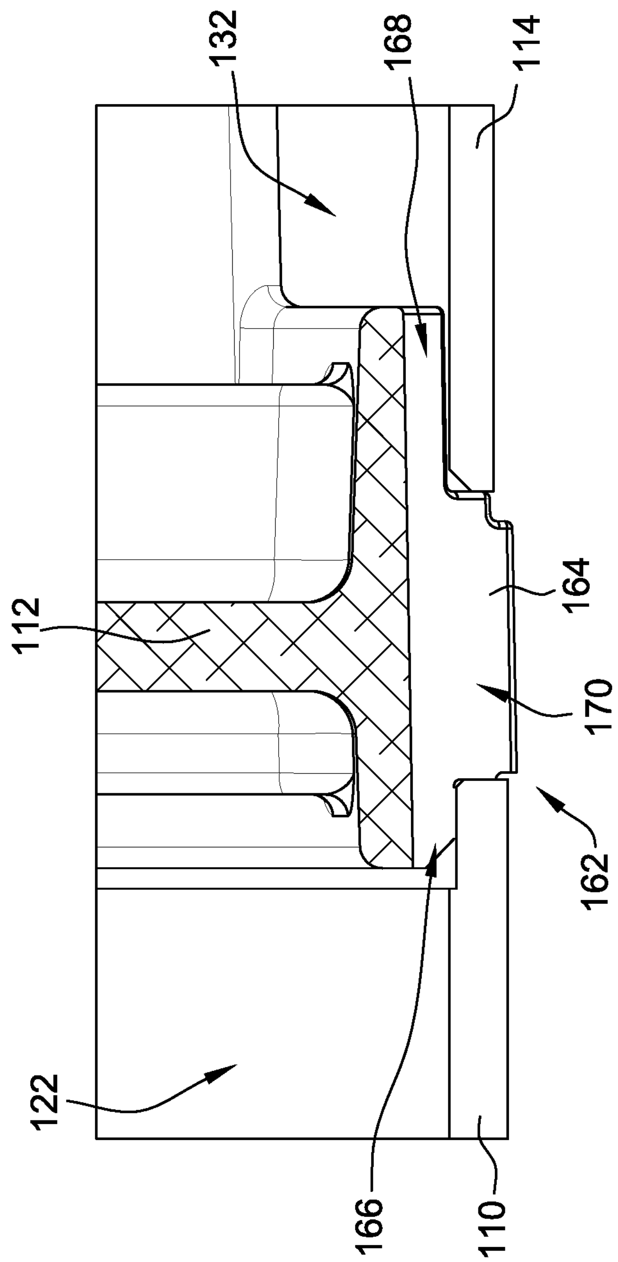
FIG. 11 is a cross-sectional view of the drain shown in FIG. 9.

FIG. 9 is a bottom view of a drainage 162 formed in housing 106; FIG. 10 is a perspective view of a portion of mid-frame 112; and FIG. 11 is a cross-sectional view of drainage 162 illustrating mid-frame 112 and first and second housing portions 110 and 114. More specifically, mid-frame 112 and first and second housing portions 110 and 114 combine to define drainage 162 to allow moisture to exit housing 106. Mid-frame 112 includes a groove 164 formed in its outer periphery that extends the entire axial length of mid-frame 112. Groove 164 is spaced radially inward from first housing portion 110 to define a first axial gap 166 therebetween. Similarly, groove 164 is spaced radially inward from second housing portion 114 to define a second axial gap 168 therebetween. In some embodiments, the groove 164 extends the compete axial length of the mid-frame 112. Gaps 166 and 168 allow any moisture within compartments 122 and 132 to exit housing 106 via drainage 162. In some embodiments, the groove 164 is spaced radially inwardly from the first and the second end to define gaps therebetween. In some embodiments, the first end and the second end overlap with opposing ends of the groove 164 to prevent moisture ingress into the housing 106.

As shown in FIG. 11, first and second housing portions 110 and 114 define an axial gap 170 therebetween their adjacent ends. Furthermore, groove 164 includes an axial length that is longer than gap 170 such that groove 164 radially overlaps with ends of first and second housing portions 110 and 114. In such a configuration, any incoming moisture impinges upon groove 164 of mid-frame 112 and is prevented from entering housing 106. The right-angle path of drainage 162 makes it difficult for water to enter housing 106.

Figure 12:
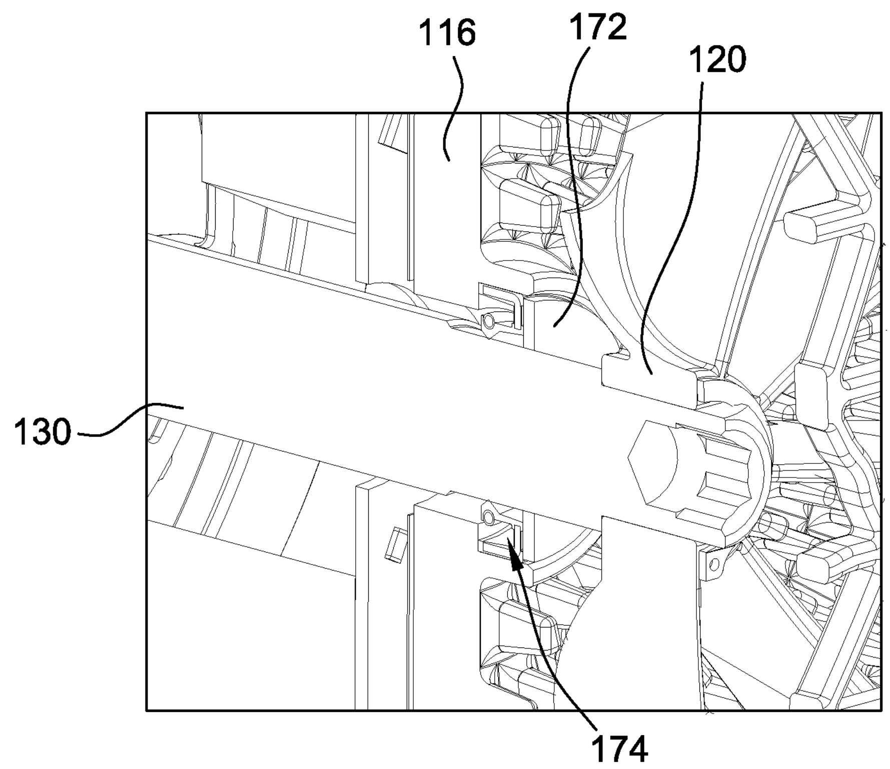
FIG. 12 is a perspective cross-sectional view of a portion of the electrical machine assembly shown in FIG. 1.
Figure 13:
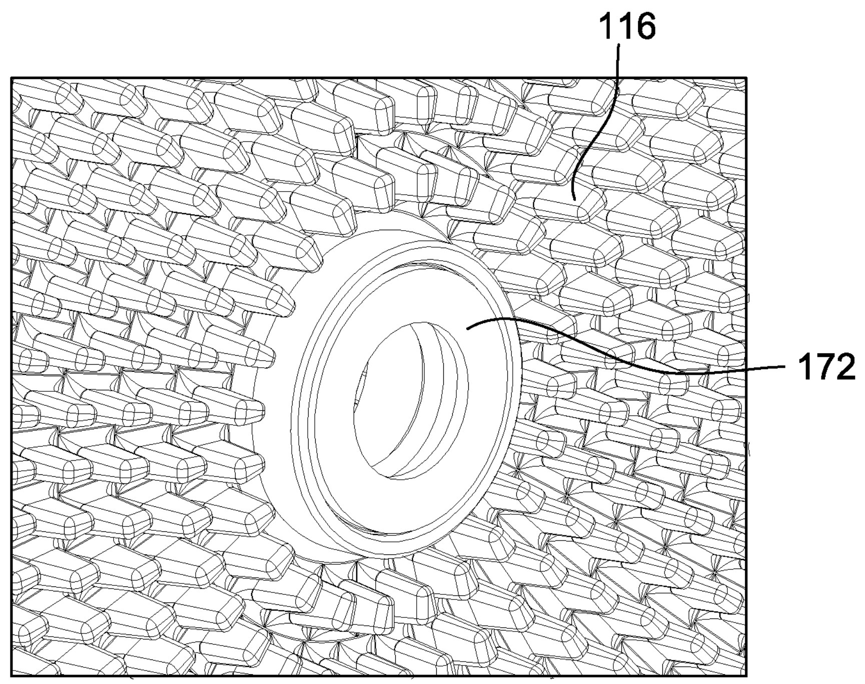
FIG. 13 is a perspective view of an end frame for use with the electrical machine assembly shown in FIG. 1.

FIG. 12 is a perspective cross-sectional view of a portion of electrical machine assembly 100; and FIG. 13 is a perspective view of end frame 116. In one embodiment, end frame 116 includes a cup portion 172 that partially circumscribes shaft 130. In some embodiments, the shaft 130 extends through the first compartment 122, the mid-frame 112, and the second compartment 132. More specifically, shaft 130 includes a circumferential groove 174 that receives cup portion 172 of end frame 116. Cup portion 172 is not a complete circle and does not totally circumscribe shaft 130. Specifically, cup portion 172 extends at least 180 degrees around shaft 130. Such a configuration defines a labyrinth seal about shaft 130 and end frame 116 that allows air to pass through, but does not allow moisture to enter housing 106. The water flows onto groove 174 and then rolls onto the bottom portion of end frame 116, where it rolls off with the rest of the water. The asymmetric aspect of such a configuration also allows cup portion 172 come further down in the shaft groove 174 because shaft 130 can be installed at an angle. Furthermore, a shaft with a larger radius towards its end can be used because of the open space created by cup portion 172 not extending all the way around shaft 130.

Figure 14:
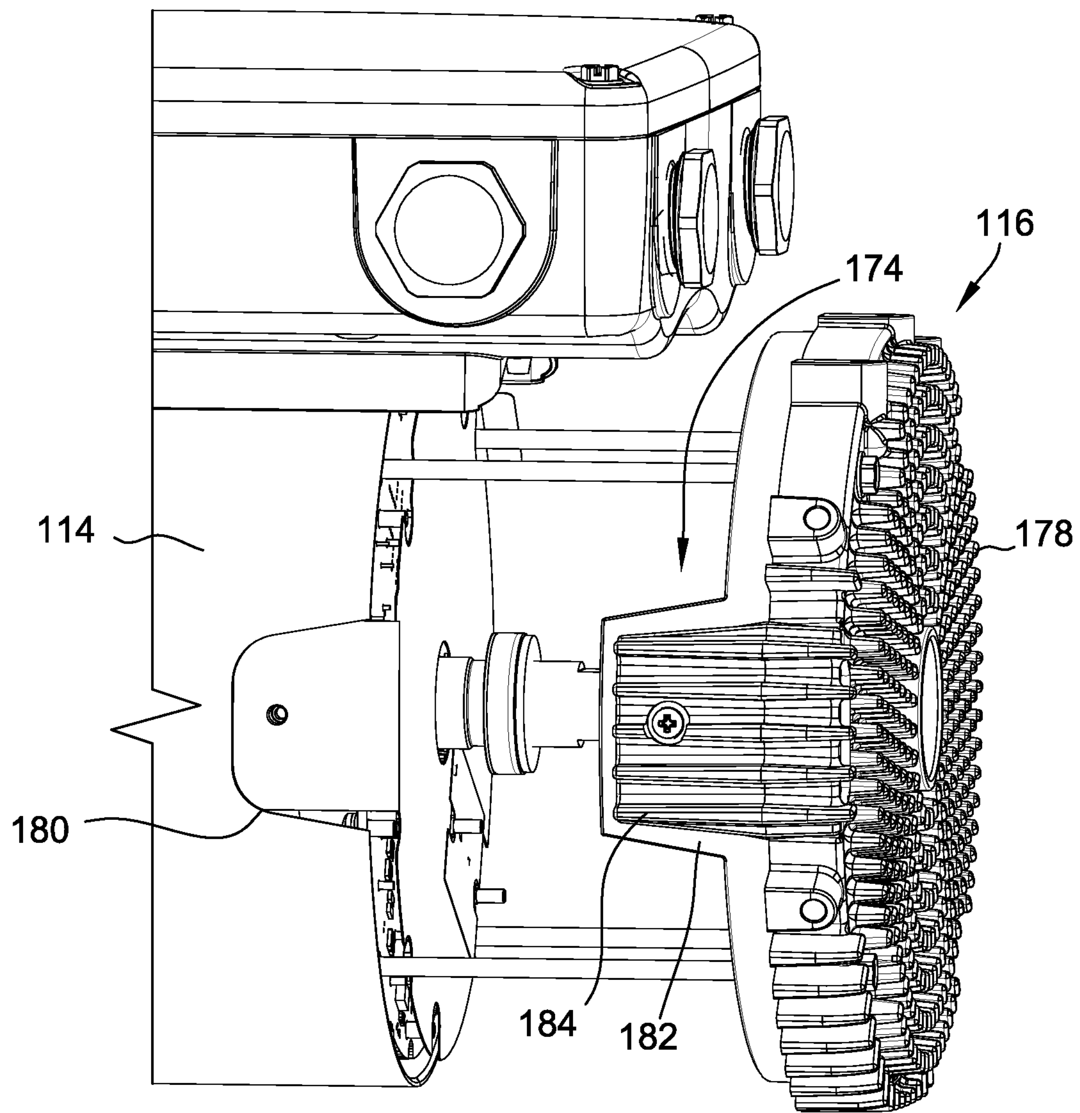
FIG. 14 is a partially exploded view illustrating a portion of the housing and the end frame.
Figure 15:
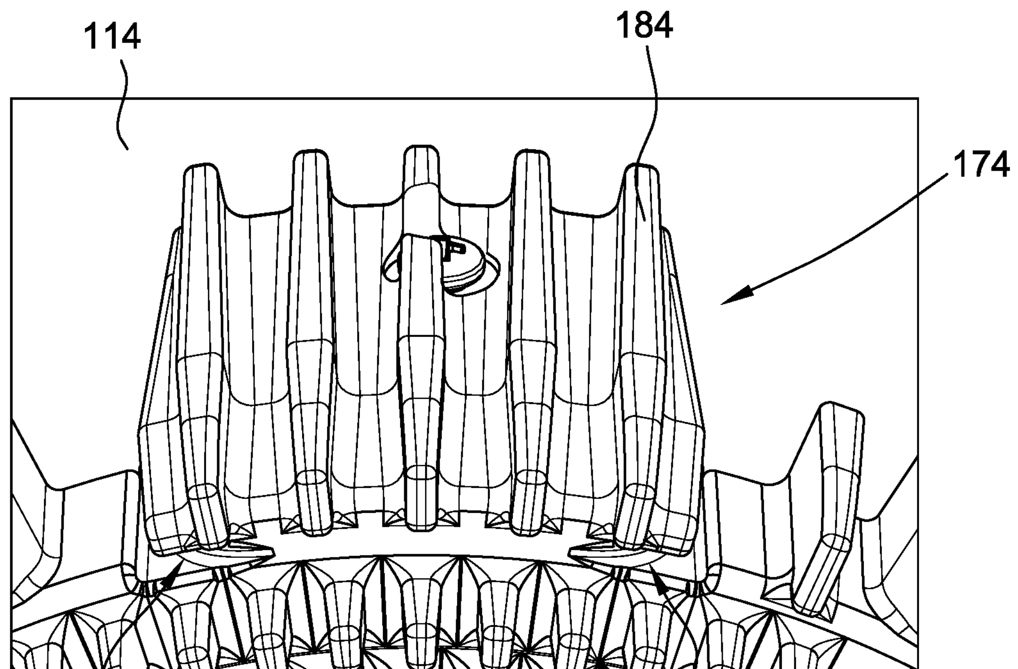
FIG. 15 is a perspective view of an extension portion of the end frame shown in FIG. 14.
Figure 16:
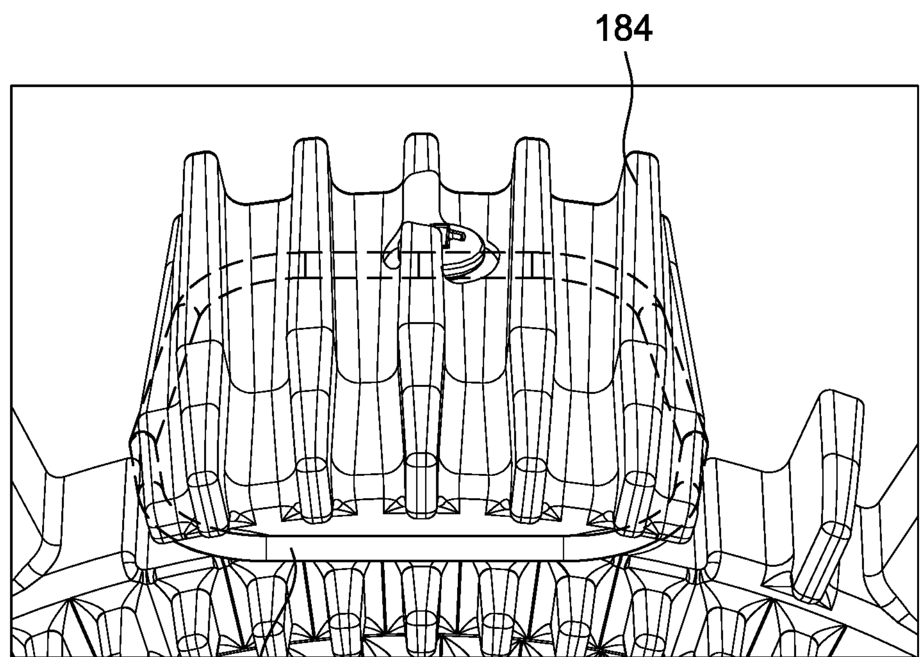
FIG. 16 is another perspective view of an extension portion of the end frame shown in FIG. 14.
Figure 17:
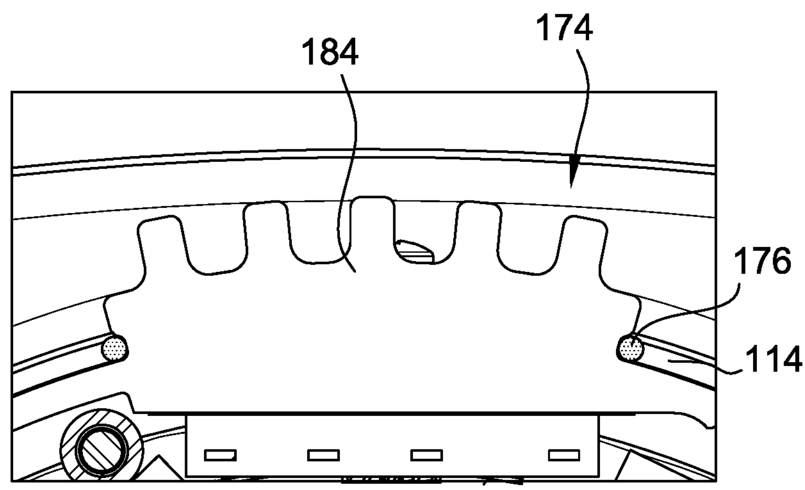
FIG. 17 is a cross-sectional view illustrating the extension portion and the housing.
Figure 18:
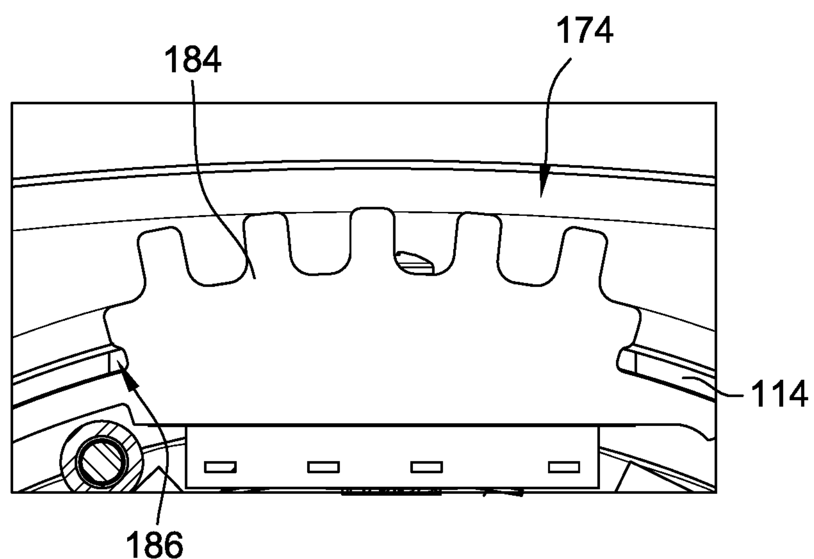
FIG. 18 is a cross-sectional view illustrating the extension portion and the housing with an O-ring therebetween.

FIG. 14 is a partially exploded view illustrating second housing portion 114 and end frame 116; FIG. 15 is a perspective view of an extension portion 174 of end frame 116; FIG. 16 is another perspective view of extension portion 174; FIG. 17 is a cross-sectional view illustrating the extension portion 174 and second housing portion 114; and FIG. 18 is a cross-sectional view illustrating extension portion 174 and second housing portion 114 with an O-ring 176 therebetween.

In the exemplary embodiment, end frame 116 includes a body portion 178 and extension portion 174 extending axially rearward toward housing 106. Extension portion 174 mates with a cutout 180 on second housing portion 114. More specifically, extension portion 174 includes a flange portion 182 that is positioned inside second compartment 132 of housing 106. Extension portion 174 also includes a cooling portion 184 with a plurality of cooling fins. Airflow from fan 120 is redirected by shroud 118 and passes over and through the fins on cooling portion 184 to facilitate cooling end frame 116. A seating groove 186 is positioned radially between flange portion 182 and cooling portion 184 and is configured to receive O-ring 176. FIGS. 15 and 18 illustrate extension portion 174 having O-ring 176 removed for clarity to show groove 186. O-ring 176 is positioned in seating groove 186 and seals against cutout 180 in second housing portion 114 to prevent moisture ingress.

As shown in FIG. 15, cooling portion 184 extends beyond seating groove 186 and captures O-ring 176. Specifically, O-ring 176 wraps around the cooling portion 184, and seating groove 186 is of sufficient depth to allow for easy installation with very low risk of O-ring 176 decoupling.

Figure 19:
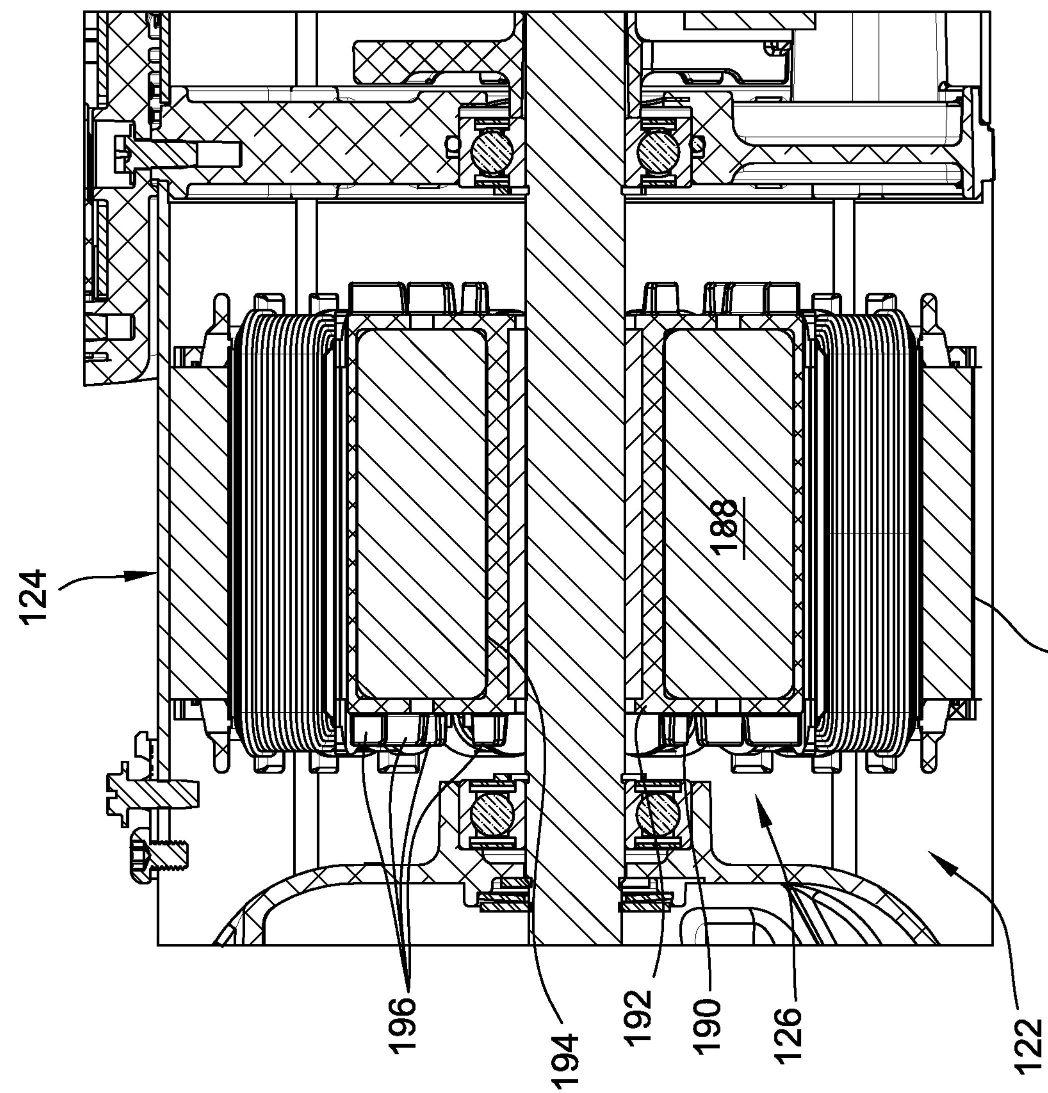
FIG. 19 is a cross-sectional view of a motor of the electrical machine assembly.
Figure 20:
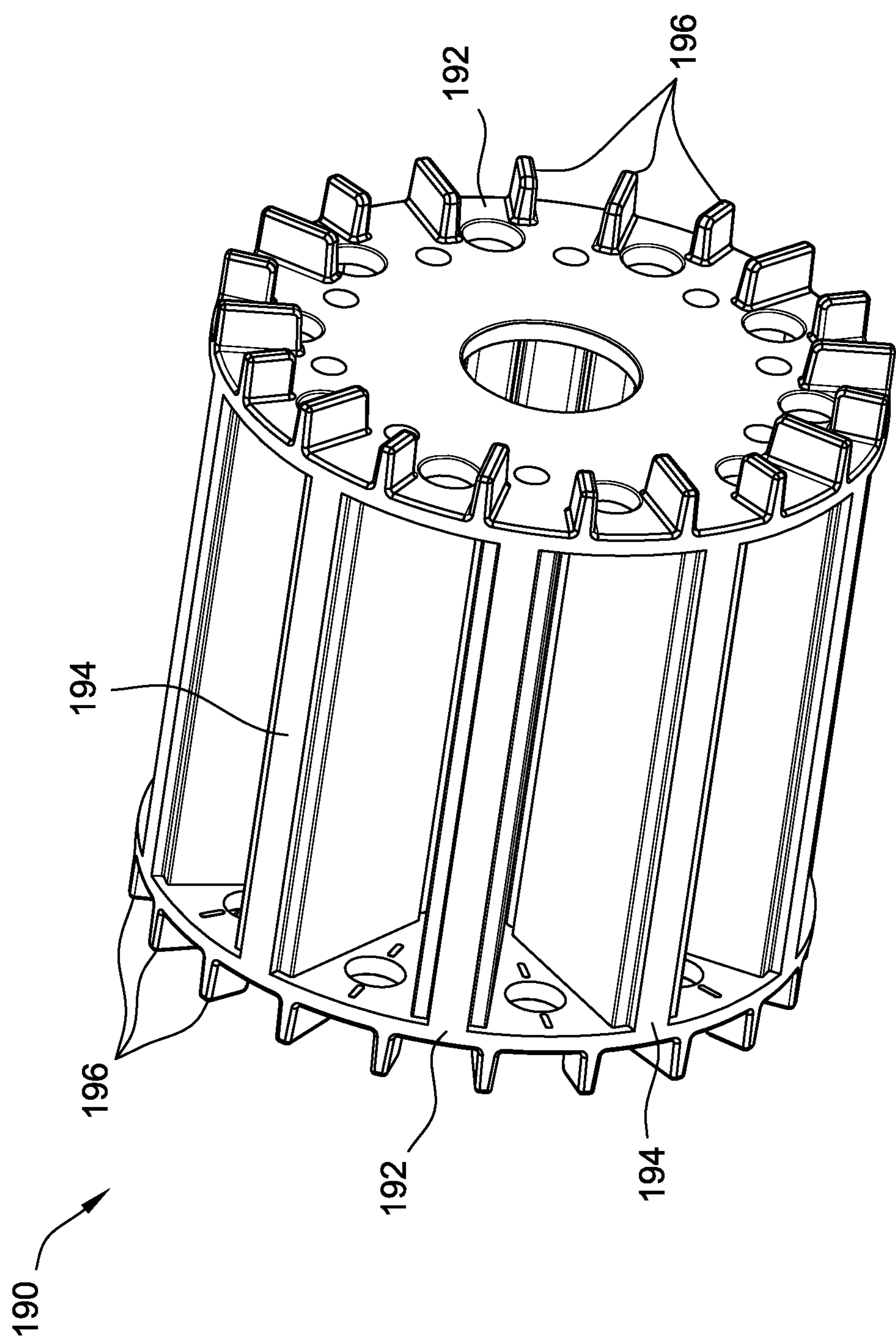
FIG. 20 is a perspective view of a rotor frame of the motor of FIG. 19.

FIG. 19 is a cross-sectional view of motor 124 including stator 128 and rotor 126. In the exemplary embodiment, rotor 126 includes a plurality of magnets 188 positioned within a rotor frame 190. FIG. 20 is a perspective view of rotor frame 190. In the exemplary embodiment, rotor frame 190 is manufactured from a plastic material and is overmolded around magnets 188. In some embodiments, the rotor 126 is positioned radially inward of the stator 128 and is configured to rotate about an axis during operation.

Rotor frame 190 includes a pair of opposing end plates 192 connected by a plurality of longitudinal members 194 extending between the opposing end plates 192. The plurality of longitudinal members 194 are positioned between adjacent magnets 188.

In the exemplary embodiment, each end plate 192 includes a plurality of axially extending fins 196 that are integrally formed with end plates 102 and members 194 from a plastic material. The plurality of axially fins 196 extend in a direction opposite a direction of the longitudinal members 194. In some embodiments, the plurality of axially extending fins 196 are circumferentially spaced about at least one end plate 192. In some embodiments, the plurality of axially extending fins 196 are positioned proximate to an outer periphery of the at least one end plate 192 such that an outer periphery of the plurality of axially extending fins 196 is radially flush with the outer periphery of the at least one end plate 192.

As rotor 126 rotates, integrated plastic rotor fins 196 move and mix the air within compartment 122 at high velocity to channel the air over stator 128 to provide cooling. This high velocity air increases the heat transfer rate from stator 128 via forced convection to first housing portion 110 and then away from electrical machine assembly 100. In some embodiments, the plurality of axially extending fins 196 are configured to generate a cooling airflow within a housing 106 of the electric machine assembly 100. In some embodiments, the plurality of axially extending fins 196 are configured to provide cooling to the stator 128 during operation.

The opposing end plates 192 and the plurality of longitudinal members 194 combine to define a plurality of openings that are each configured to receive a magnet of the plurality of magnets 188. In some embodiments, the pair of opposing end plates 192 include a first end plate and a second end plate, and the plurality of axially extending fins 196 include a first plurality of fins 196 extending from the first plate 192 and a second plurality of fins 196 extending from the second end plate 192. In some embodiments, the first plurality of fins 196 and the second plurality of fins 196 are integrally formed from a plastic material with the first end plate 192 and the second end plate 192 and the longitudinal members 194. In some embodiments, the first plurality of fins 196 extend a first distance from the first end plate 192, and the second plurality of fins 196 extend a second distance from the second end plate 192. In some embodiments, the first distance is substantially similar to the second distance. In some embodiments, the first distance is different than the second distance.

A method of manufacturing a rotor 126 comprises the steps of coupling the plurality of circumferentially spaced longitudinal members 194 between the pair of opposing end plates 192 to form the rotor assembly frame 190, extending the plurality of axially extending fins 196 from at least one end plate 192 in a direction opposite the plurality of circumferentially spaced longitudinal members 194 and coupling a plurality of magnets 188 to the rotor frame 190 by positioning a magnet of the plurality of magnets 188 into a respective opening of the plurality of openings.

Figure 21:
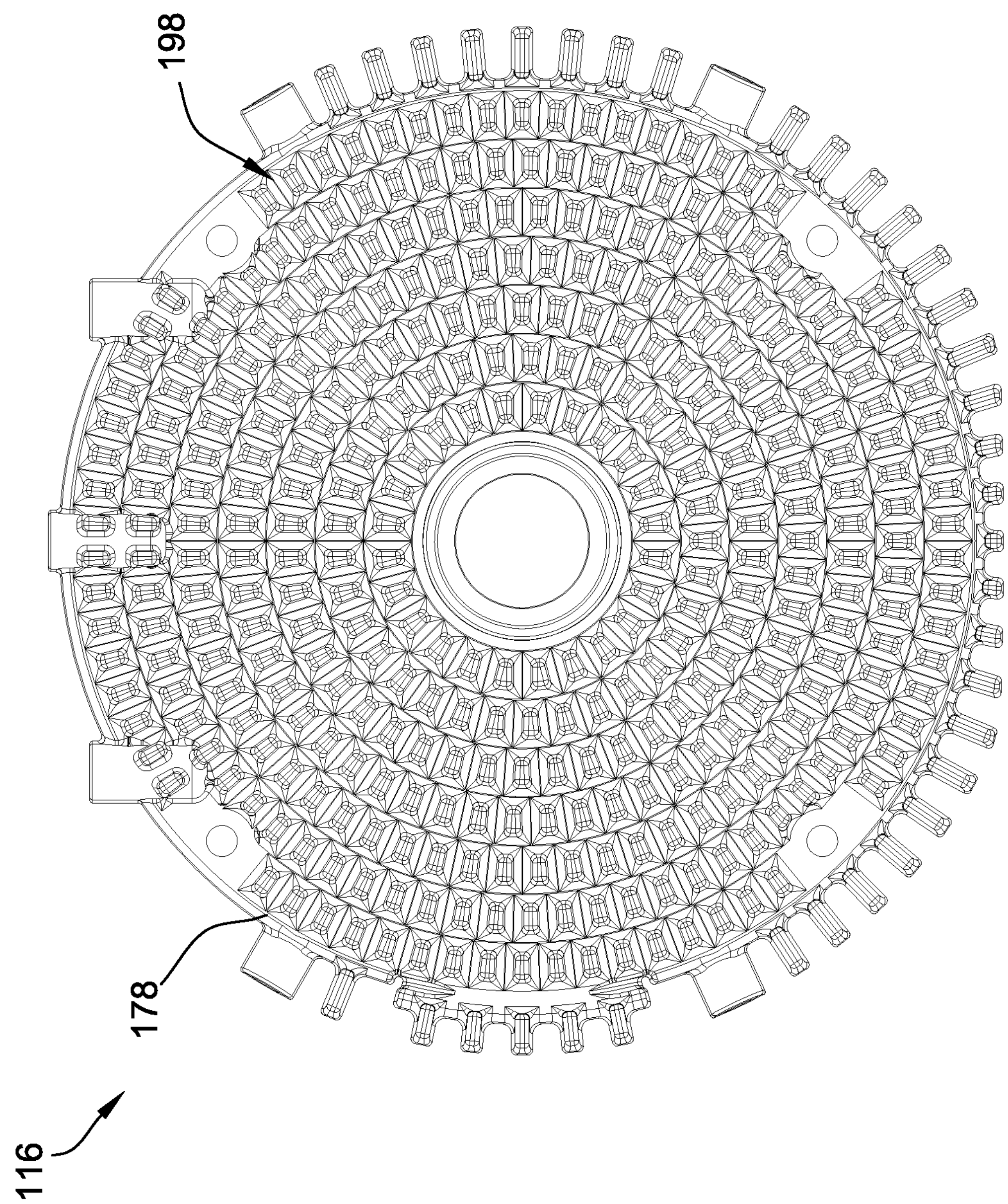
FIG. 21 is an end view of the end frame.
Figure 22:
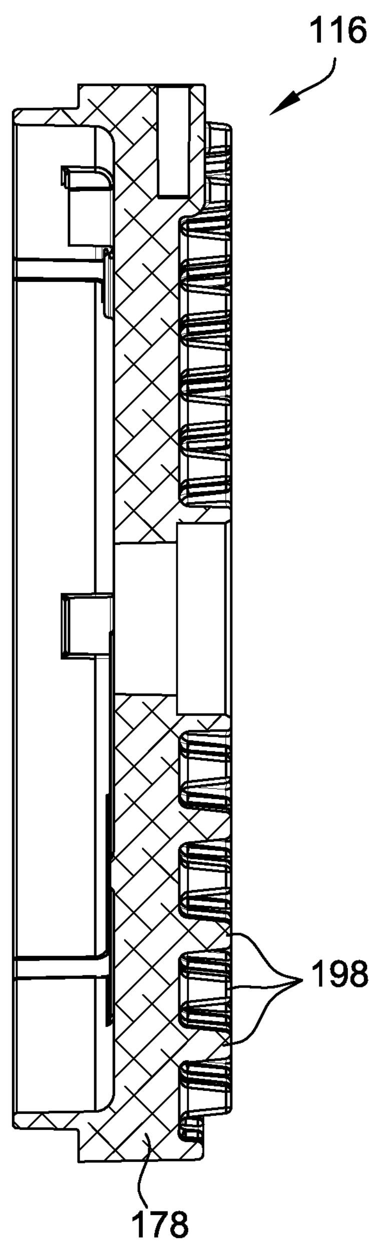
FIG. 22 is a cross sectional view of the end frame shown in FIG. 21.

FIG. 21 is an end view of end frame 116, and FIG. 22 is a cross sectional view of end frame 116. In the exemplary embodiment, body portion 178 of end frame 116 includes a plurality of pins 198 that extend axially from an end surface of the end frame 116 and facilitate cooling of the machine assembly 100. More specifically, pins 198 are rectangular in shape and are oriented radially lengthwise to facilitate casting. Furthermore, pins 198 are formed in concentric circles, but are slightly circumferentially offset from an immediately radially adjacent circles of pins 198 to facilitate cooling. In some embodiments, the plurality of pins 198 are tapered to narrow as they extend from the end surface of the end frame 116. In some embodiments, the end frame 116 comprises a second plurality of pins 198 extending from a radial periphery of the end frame 116. In some embodiments, the end frame 116 further comprises a second plurality of pins **198*a* extending about at least a portion of a radially outer periphery of the end frame 116**.

Such a configuration of pins 198 forms a tortuous path across the end surface of the end frame 116 for airflow and allows air to flow in any direction along end frame 116. The design of pins 198 with a longer radial length and even spacing between allows a high amount of slender, tall pins to be cast. As such, a maximum density of pins 198 based on casting limitations is achieved.

A method of manufacturing the end frame 116 for use with an electric machine assembly, the method comprising forming the end surface of the end frame 116 and forming the plurality of pins 198 that extend axially from the end surface. Forming the plurality of pins 198 comprises forming the second plurality of pins **198*a* extending about at least a portion of a radially outer periphery of the end frame 116. In some embodiments, forming the plurality of pins 198 comprises forming the plurality of pins 198 that are rectangular in shape and oriented radially lengthwise. In some embodiments, forming the plurality of pins 198 comprises forming the plurality of pins 198 such that the pins 198** are tapered to narrow as they extend from the end surface.

Figure 23:
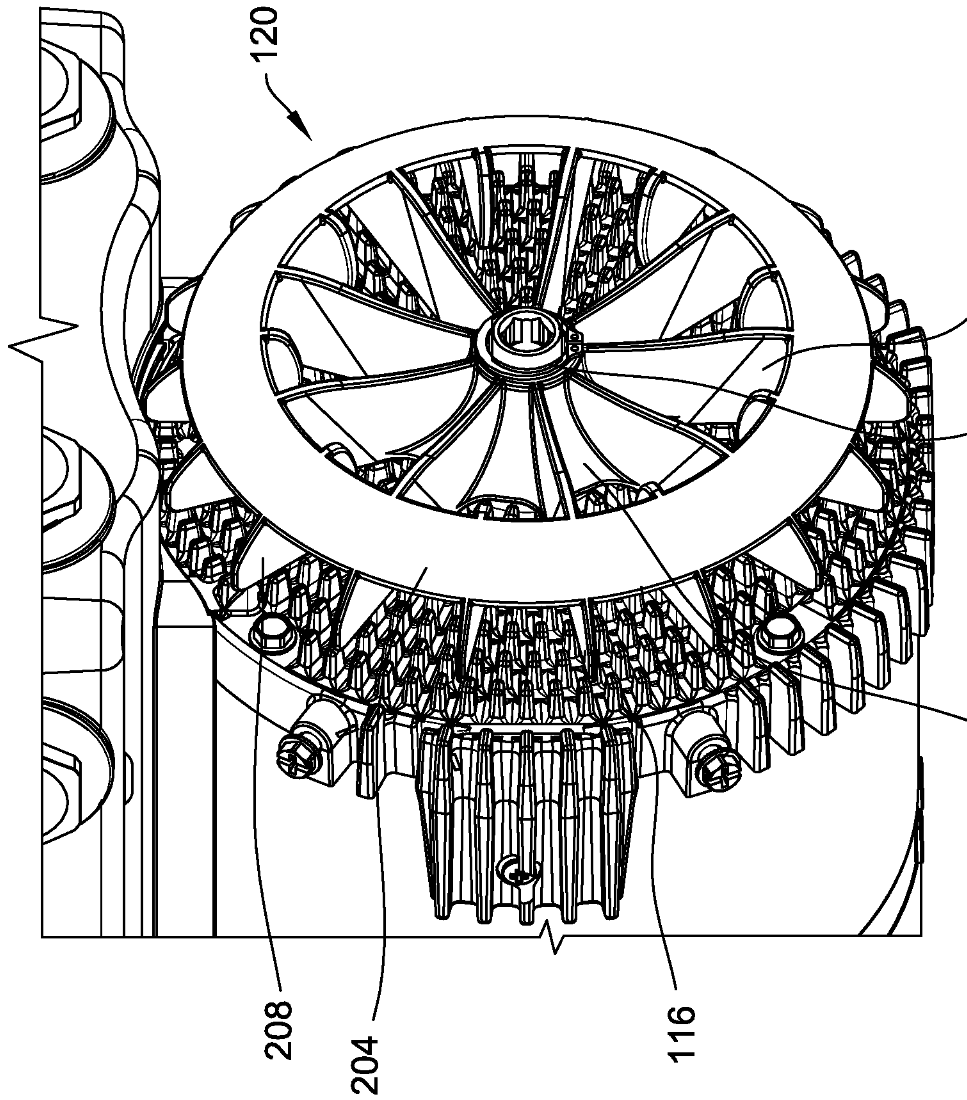
FIG. 23 is a perspective view of the end of the electrical machine assembly illustrating a fan.
Figure 24:
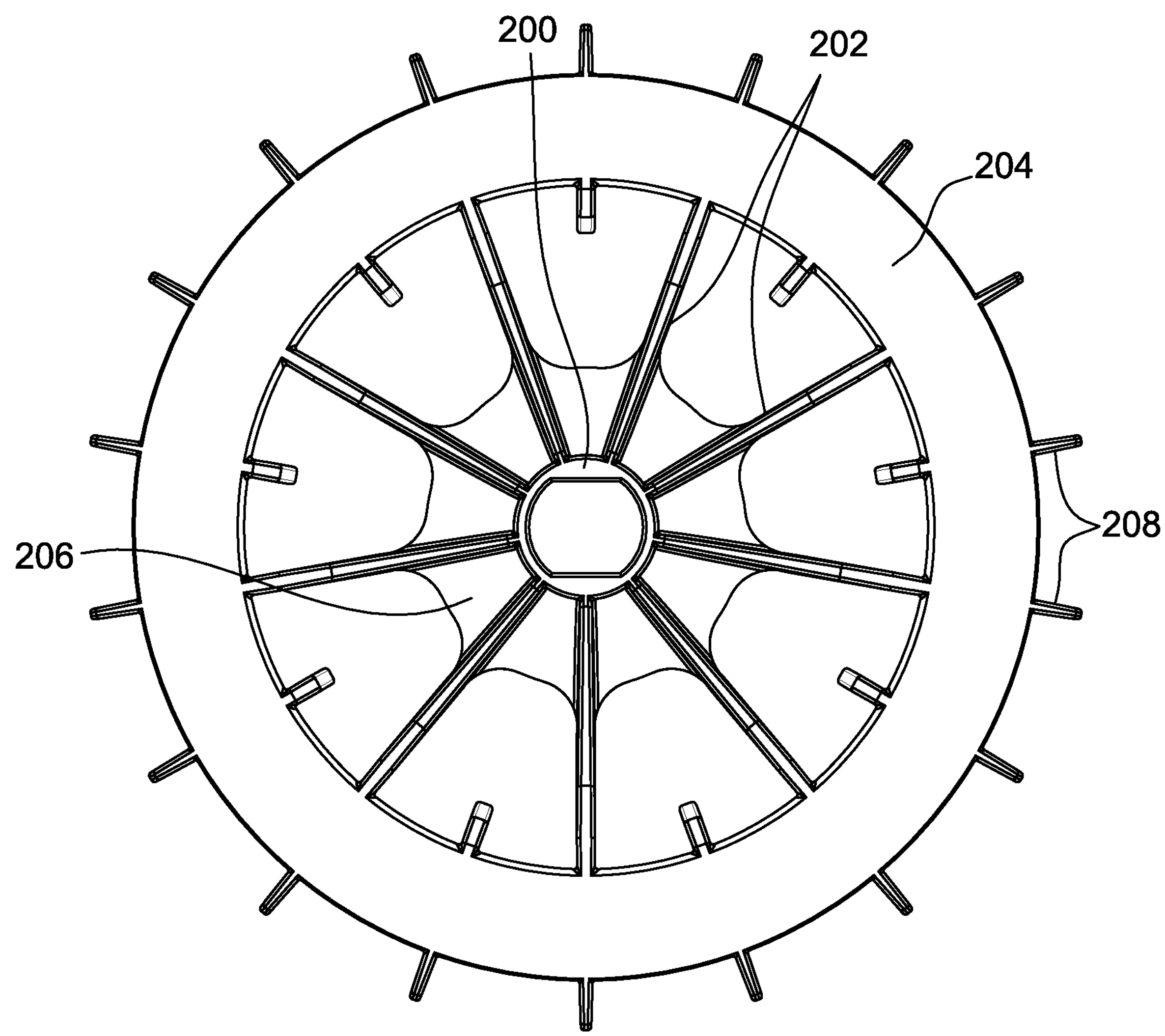
FIG. 24 is a front view of the fan shown in FIG. 23.
Figure 25:
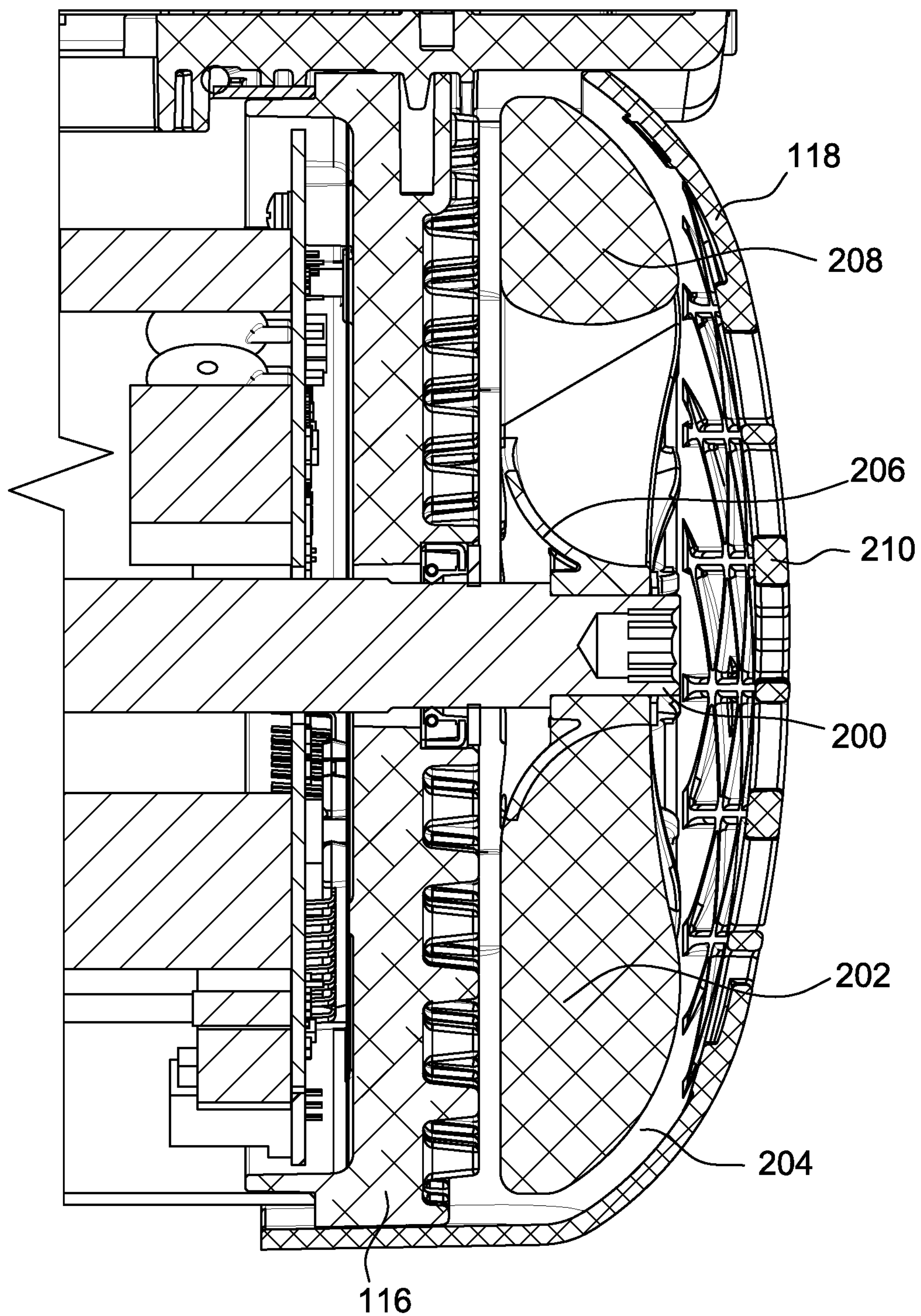
FIG. 25 is a cross-sectional view of the end of the electrical machine assembly.

FIG. 23 is a perspective view of the end of electrical machine assembly 100 illustrating fan 120; FIG. 24 is a front view of fan 120; and FIG. 25 is a cross-sectional view of the end of the electrical machine assembly 100. In the exemplary embodiment, fan 120 includes a central hub 200 positioned about shaft 130, a plurality of blades 202 extending radially from hub 200, and an outer ring 204 coupled to each of blades 202 such that blades 202 extend beyond outer ring 204. Fan 120 further includes webbing 206 extending between adjacent blades 202 proximate hub 200. Webbing 206 and outer ring 204 provide stiffness to blades 202. A plurality of disconnected blades 208 are coupled to outer ring 204 and alternate with blades 202. Blades 208 extend inward from outer ring 204, but terminate prior to reaching webbing 206. In operation, rotation of shaft 130 causes rotation of fan 120 within shroud 118 and provides cooling airflow to end frame 116 and plurality of pins 198. Specifically, rotation of fan 120 pulls air through the end grille 210 of shroud 118. A portion of the air will be channeled along housing 106 for cooling, and a second portion of the air passes behind blades 202 and facilitates cooling end frame 116.

Figure 26:
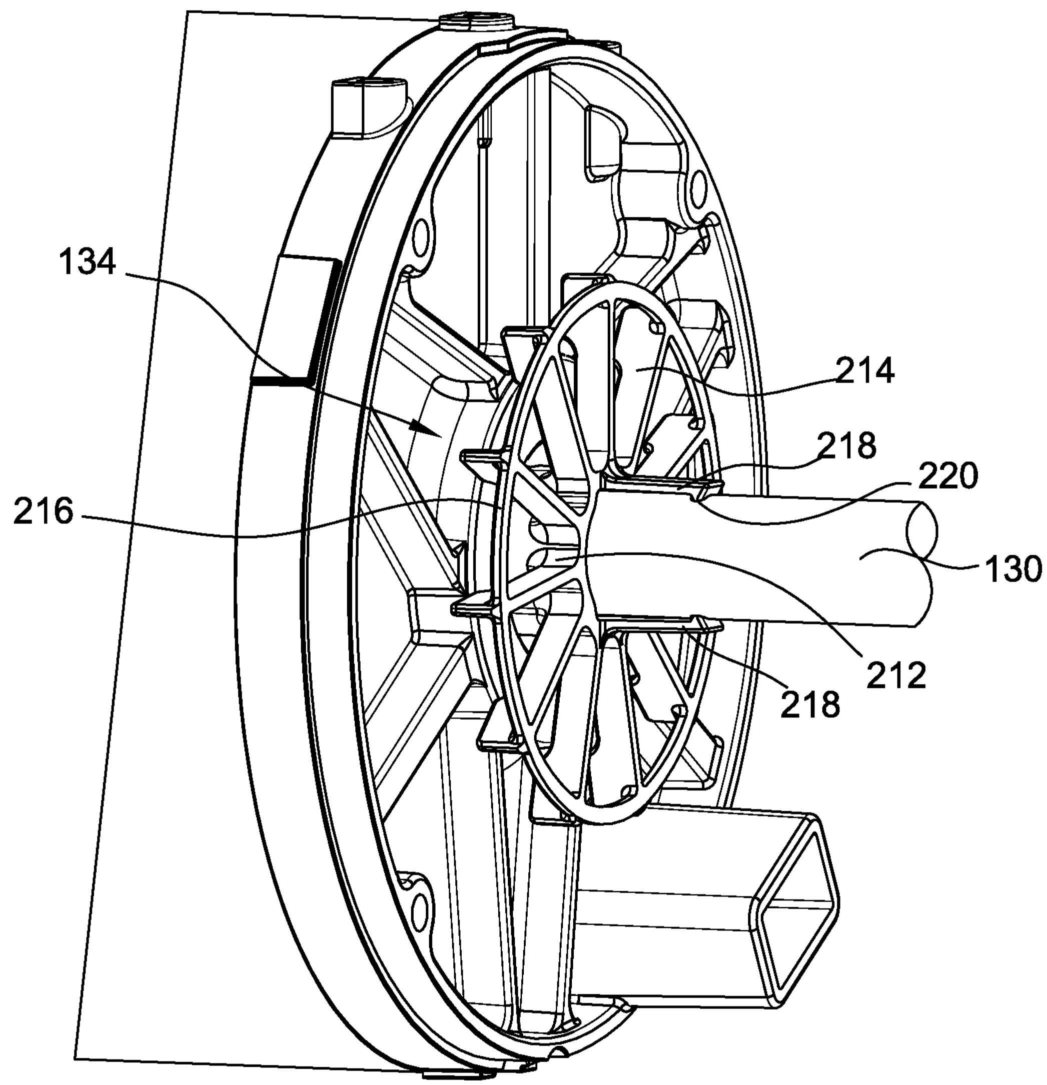
FIG. 26 is a perspective view of the inside of the electrical machine assembly illustrating an interior fan.
Figure 27:
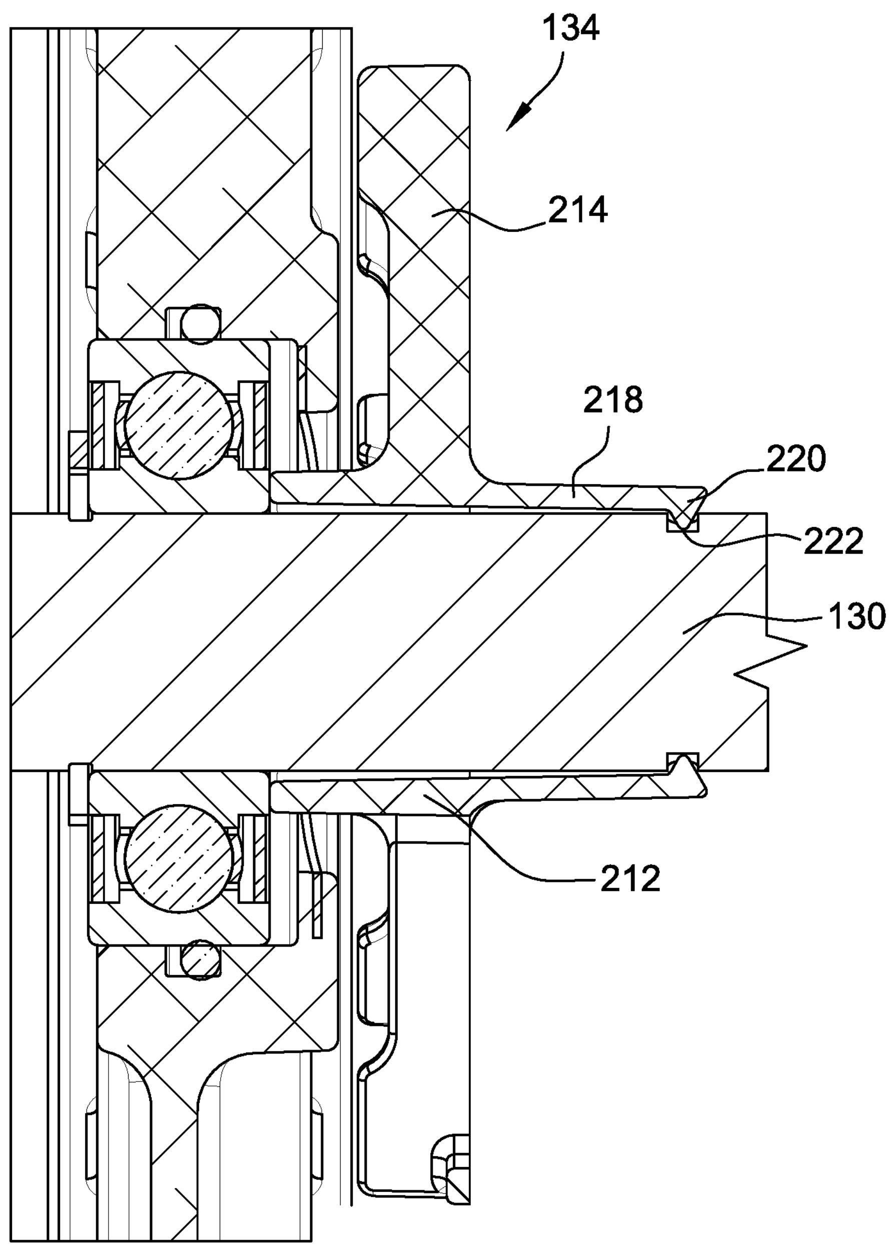
FIG. 27 is a cross-sectional view of the fan shown in FIG. 26.

FIG. 26 is a perspective view of the inside of electrical machine assembly 100 illustrating internal fan 134, and FIG. 27 is a cross-sectional view of internal fan 134. In the exemplary embodiment, the internal fan 134 is positioned inside the second compartment 132 and adjacent mid-frame 112. Internal fan 134 includes an inner hub 212 that circumscribes shaft 130, a plurality of blades 214 extending radially from hub 212, and an outer ring 216 coupled to each of blades 214. Internal fan 134 also includes a pair of clip arms 218 that extend axially along shaft 130 from hub 212. Each clip arm 218 includes a projection 220 at its distal end that extends downward and is configured to engage a slot 222 formed in shaft 130 to prevent rotation of fan 134 with respect to shaft 130. Stated differently, the slot 222 is configured to receive the projection 220 of the at least one clip arm 218 to prevent rotation of the internal fan 134 relative to the shaft 130. In some embodiments, the internal fan 134 comprises a plurality of circumferential openings, and each opening is defined by a pair of adjacent blades 214.

In operation, fan 134 recirculates the air within second compartment 132 to increase heat transfer from the hottest points via forced convection and turbulence. Specifically, it provides cooling air to electrical components 136. Fan 134 mounts with flexing clip arms 218 that click into slots 222 that are cut into the shaft 130, giving an assembler confidence that fan 134 is properly secured.

Figure 28:
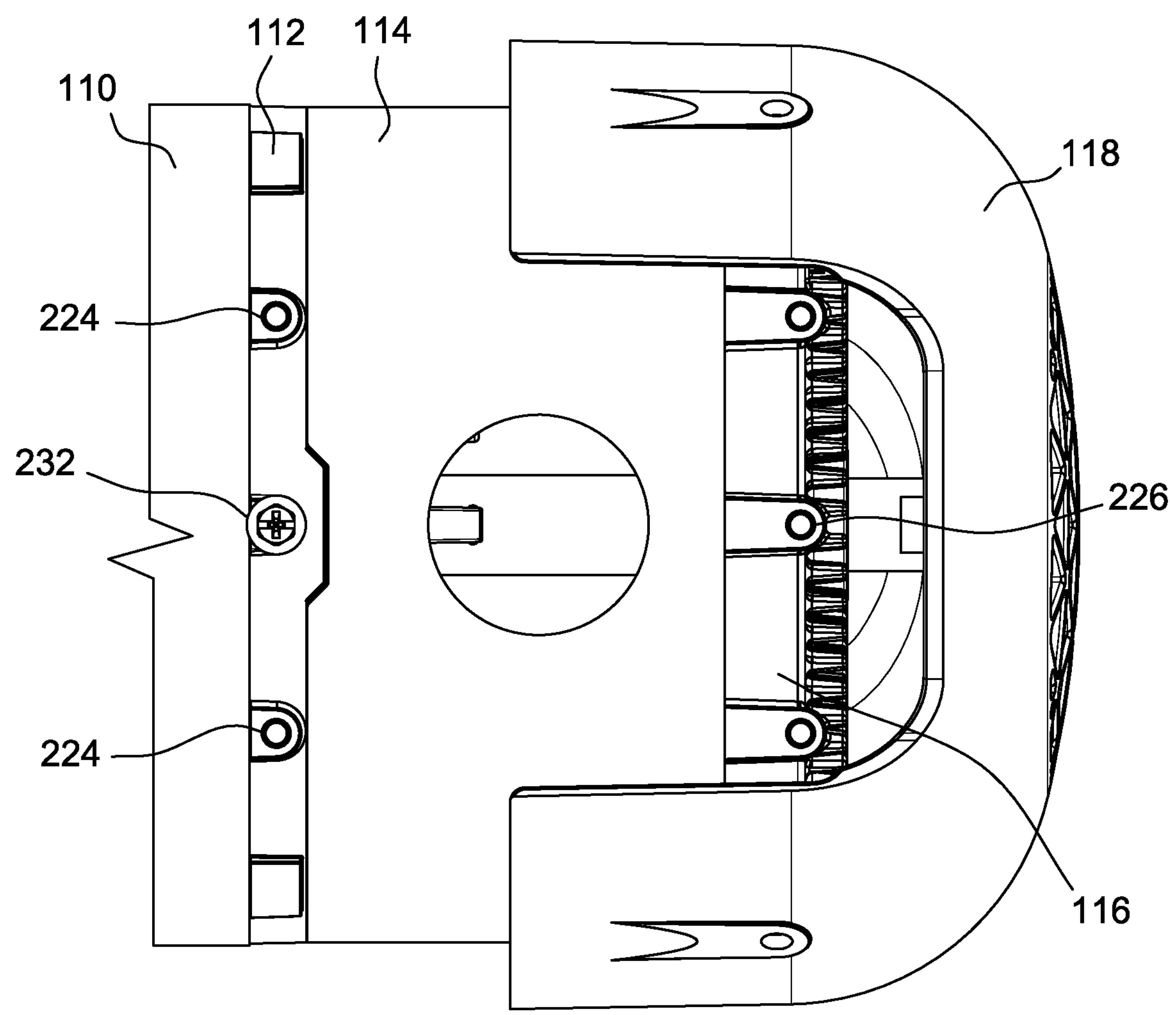
FIG. 28 is a top view of the electrical machine assembly with the terminal box removed.
Figure 29:
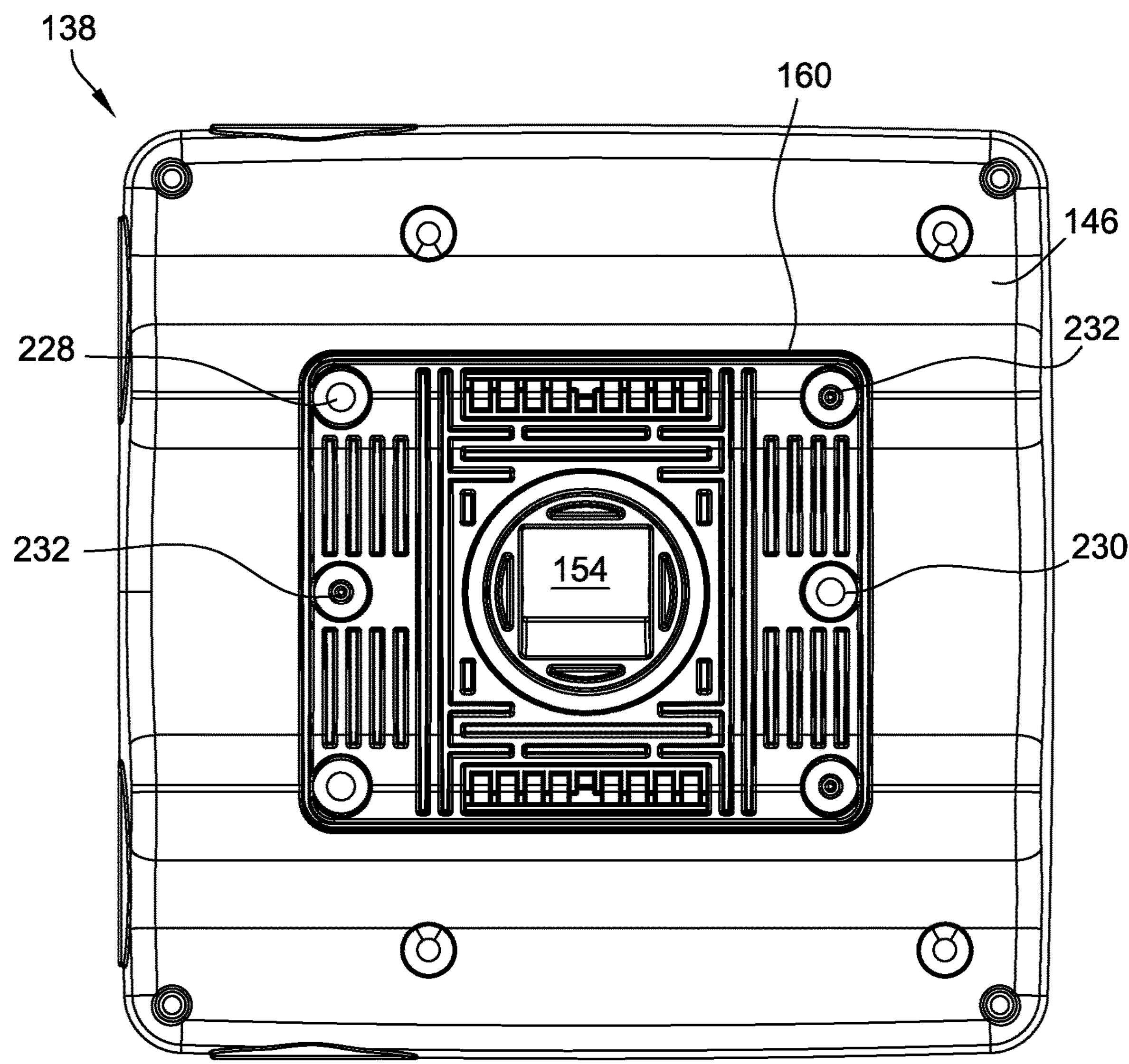
FIG. 29 is a bottom view of the terminal box.

FIG. 28 is a top view of the electrical machine assembly 100 with the terminal box 104 removed; and FIG. 29 is a bottom view of the terminal box 104. As shown in FIG. 28, mid-frame 112 includes a plurality of mounting openings 224 for mounting base 138 of terminal box 104 to mid-frame 112. Similarly, end frame 116 includes a plurality of mounting openings 226 for mounting base 138 to end frame 116. Additionally, base 138 includes a first plurality of openings 228 on one side of central opening 154 and a second plurality of openings 230 on the opposite side of central opening 154. The base 138 is symmetrical and reversible in orientation between a first orientation and a second orientation.

During assembly, first plurality of openings 228 in base 138 are aligned with mid-frame openings 224 and second plurality of openings 230 in base 138 are aligned with end frame openings 226. However, because terminal box 104 is reversible in orientation, first plurality of openings 228 in base 138 may also be aligned with end frame openings 226 and second plurality of openings 230 in base 138 may be aligned with mid-frame openings 224. Additionally, in the exemplary embodiment, each plurality of openings 224, 226, 228, and 230 includes three openings. However, not all openings of each set may be used at the same time. For example, a fastener 232 may be inserted through a central opening of mid-frame openings 224 and a central opening of first plurality 228 to couple terminal box 104 to housing 106. The remaining openings on either side of fastener 232 may receive a plug to prevent moisture ingress. In such a configuration, a fastener 232 is inserted through the end openings of end frame openings 226 and second plurality of openings 230 while the central opening receives a plug. The opposite configuration is also possible because terminal box base 138 is symmetrical and reversible in orientation based on in which direction the installer prefers to channel wiring from terminal box 104.

In some embodiments, the first plurality of housing openings (mid-frame openings 224) are aligned with the first plurality of base openings 228 in the first orientation, and the first plurality of housing openings 224 are aligned with the second plurality of base openings 230 in the second orientation. In some embodiments, the second plurality of housing openings (end frame openings 226) are aligned with the second plurality of base openings 230 in the first orientation, and the second plurality of housing openings 226 are aligned with the first plurality of base openings 228 in the second orientation. In some embodiments, the central opening is aligned with a wiring opening in the housing 106 in both the first orientation and the second orientation. In some embodiments, the central opening is positioned on the base 138 between the first plurality of base openings 228 and the second plurality of base openings 230.

In some embodiments, in the first orientation, a first subset of the first plurality of housing openings 224 and a first subset of the first plurality of base openings 228 are configured to receive a fastener therethrough. In some embodiments, the first subset of the first plurality of housing openings 224 are aligned with the first subset of the first plurality of base openings 228. In some embodiments, in the second orientation, a second subset of the first plurality of housing openings 224 and a second subset of the first plurality of base openings 228 are configured to receive a fastener therethrough. In some embodiments, the second subset of the first plurality of housing openings 224 are aligned with the second subset of the first plurality of base openings 228.

In some embodiments, the terminal box 104 further comprises a plurality of plugs, and the second subset of the first plurality of housing openings and the second subset of the first plurality of base openings 228 are configured to receive a plug when the base 138 is in the first orientation. In some embodiments, the first subset of the first plurality of housing openings and the first subset of the first plurality of base openings 228 are configured to receive a plug when the base 138 is in second first orientation.

A method of assembling an electric machine assembly 100 comprises the steps of coupling the base 138 of the terminal box 104 to the housing 106 in a first orientation such that a first plurality of housing openings are aligned with the first plurality of base openings 228, removing the base 138 from the housing 106; and re-coupling the base 138 to the housing 106 in a second orientation such that such that the first plurality of housing openings are aligned with a second plurality of base openings 230. Coupling the base 138 of the terminal box 104 to the housing 106 in the first orientation comprises aligning the second plurality of housing openings with the second plurality of base openings 230. Ce-coupling the base 138 to the housing 106 in the second orientation comprises aligning the second plurality of housing openings with the first plurality of base openings 228.

In some embodiments, coupling the base 138 of the terminal box 104 to the housing 106 in the first orientation comprises inserting a fastener through a first subset of the first plurality of housing openings and through a first subset of the first plurality of base openings 228. Re-coupling the base 138 to the housing 106 in the second orientation comprises inserting a fastener through a second subset of the first plurality of housing openings and through a second subset of the first plurality of base openings 228. In some embodiments, the first subset of the first plurality of housing openings is exclusive of the second subset of the first plurality of housing openings.

In some embodiments, the method further comprises inserting a plurality of plugs into the second subset of the first plurality of housing openings and into the second subset of the first plurality of base openings 228 when the base 138 is in the first orientation. In some embodiments, the method further comprises inserting a plurality of plugs into the first subset of the first plurality of housing openings and into the first subset of the first plurality of base openings 228 when the base 138 is in the second orientation.

Figure 30:
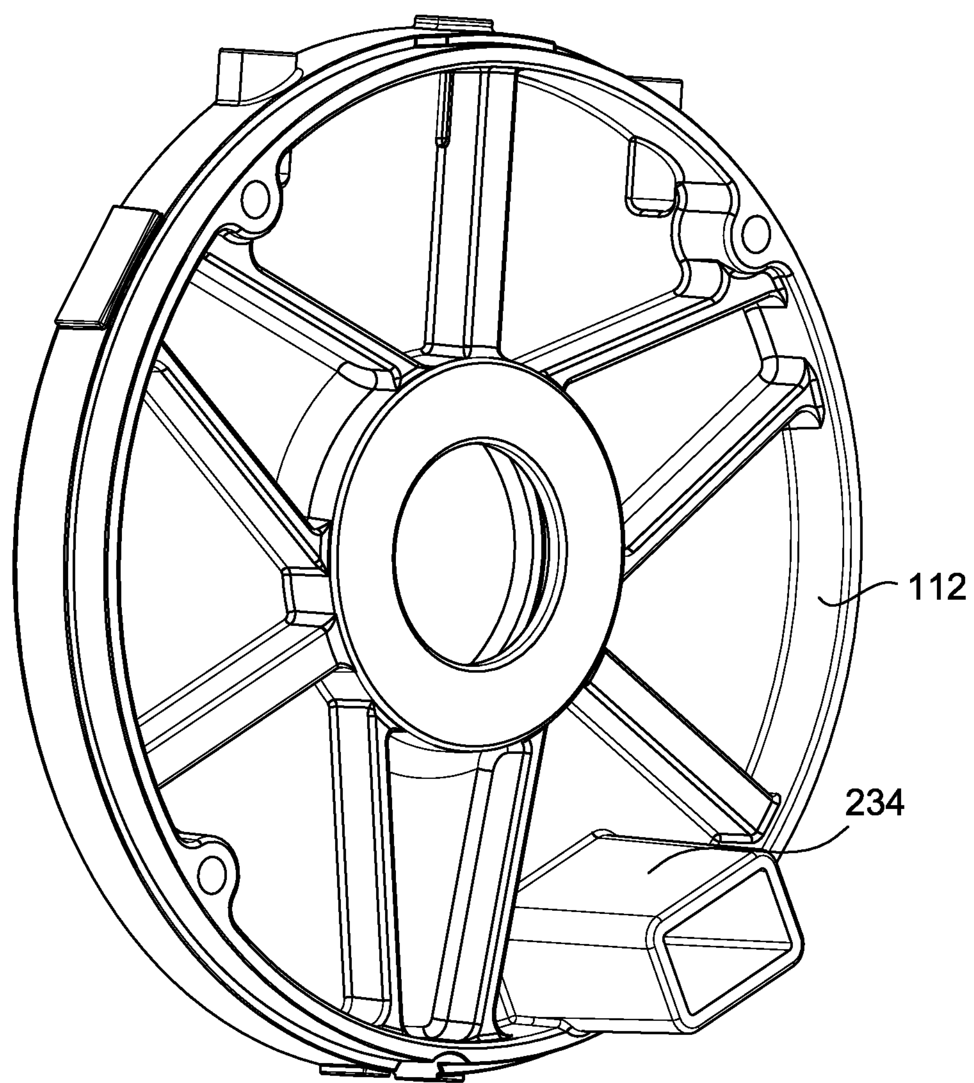
FIG. 30 is perspective view of the mid-frame.
Figure 31:
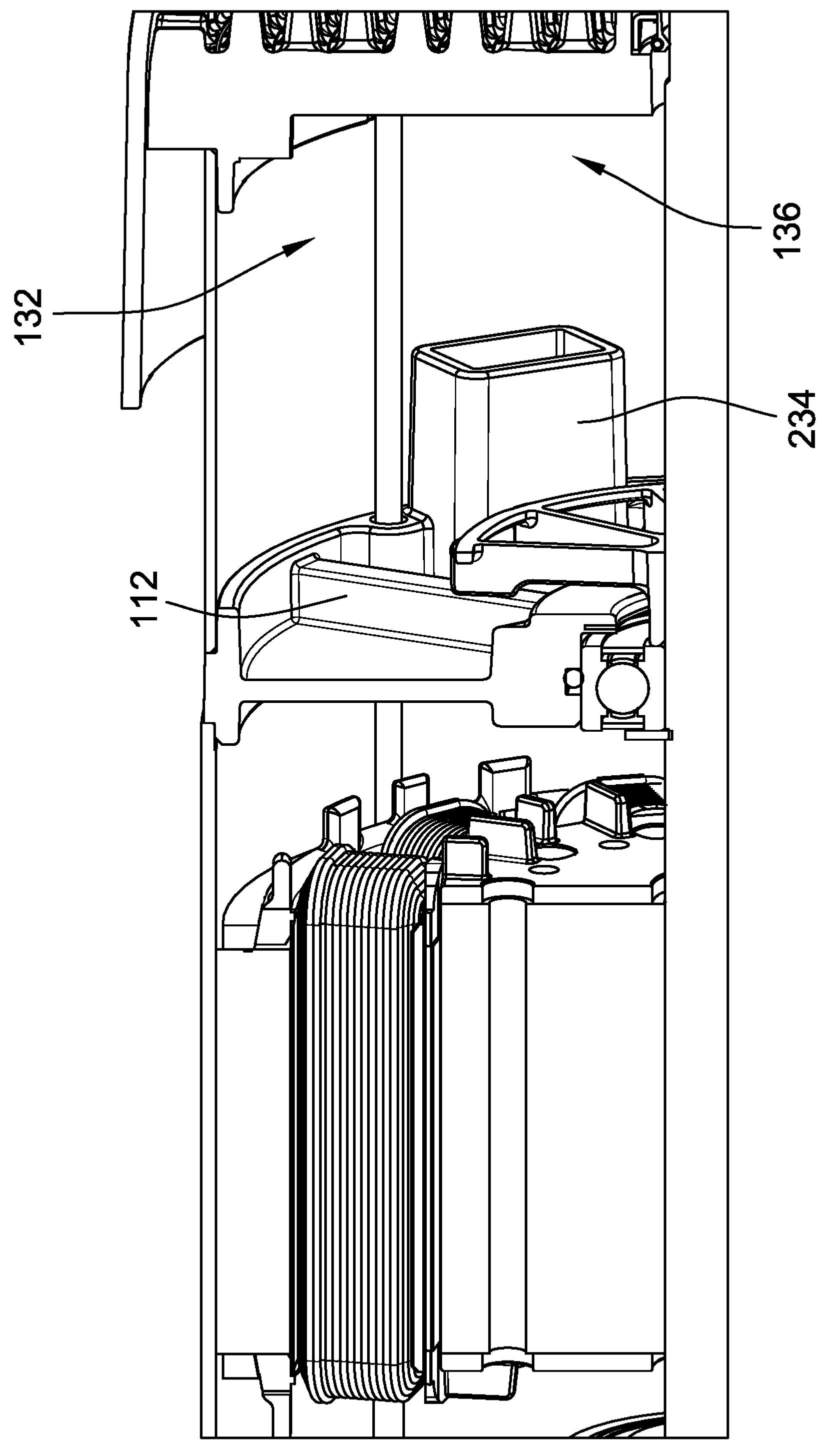
FIG. 31 is a perspective cross-sectional view of the mid-frame.

FIG. 30 is perspective view of mid-frame 112 illustrating a guide structure 234 of the mid-frame 112; and FIG. 31 is a perspective cross-sectional view of the mid-frame 112 within second compartment 132. Guide structure 234 extends axially from mid-frame 112 into second compartment 132 toward electrical component 136.

Stator 128 and electrical components 136 are connected with wiring (not shown) that extends through guide structure 234 of mid-frame 112. When the wiring is connected, there needs to be enough slack, and the wiring can bunch up when assembly 100 is bolted together. Guide structure 234 constrains the wires and guides them away from potential hazards within second compartment 132. In some embodiments, the guide structure 234 is configured to prevent contact between the rotating member and a first plurality of wires.

The mid-frame 112 includes a guide structure 234 for guiding a plurality of wires through the second compartment 132 toward the electrical component 136. In some embodiments, the guide structure 234 is positioned at an outer periphery of the mid-frame 112. In some embodiments, the mid-frame 112 includes an end surface that at least partially defines the second compartment 132. In some embodiments, the guide structure 234 comprises a sleeve that extends from the end surface. In some embodiments, a plurality of stiffening ribs extending from the end surface of the mid-frame 112.

In some embodiments, the housing 106 comprises the end frame 116 positioned opposite the mid-frame 112 to define the second compartment 132. In some embodiments, the guide structure 234 extends approximately midway between the mid-frame 112 and the end frame 116. In some embodiments, the guide structure 234 extends approximately midway between the end surface and an end frame 116 of the housing 106 and is positioned opposite the mid-frame 112 to define the second compartment 132. In some embodiments, the guide structure 234 extends into the second compartment 132 beyond a rotating member positioned within the second compartment 132.

In some embodiments, a rotating member 134 is positioned within the second compartment 132. In some embodiments, the guide structure 234 extends into the second compartment 132 beyond the rotating member. In some embodiments, the guide structure 234 tapers inward as it extends in the second compartment 132. In some embodiments, the guide structure 234 comprises a rectangular shape and a central opening through which the plurality of wires extend. In some embodiments, the guide structure 234 is positioned at an outer periphery of the mid-frame 112.

A method of assembling an electric assembly comprises the steps of coupling the mid-frame 112 to the housing 106 assembly that defines an inner cavity such that the mid-frame 112 separates the cavity into the first compartment 122 and the second compartment 132, wherein the mid-frame 112 includes the guide structure 234 for guiding the plurality of wires through the second compartment 132, positioning the electrical component 136 within the second compartment 132; positioning a rotating member within the second compartment 132; positioning the stator 128 within the first compartment 122; and extending the plurality of wires from the stator 128, through the guide structure 234, and to the electrical component 136 such that the guide structure 234 prevents contact between the plurality of wires and the rotating member.

In some embodiments, the method further comprises the step of coupling an end frame 116 to the housing 106 opposite the mid-frame 112 to define the second compartment 132. Coupling the mid-frame 112 comprises coupling the mid-frame 112 such that the guide structure 234 is positioned at an outer periphery of the mid-frame 112. In some embodiments, the method further comprises the step of coupling the electrical component 136 to the end frame 116.

The electric machine assembly described herein includes a terminal box coupled to a motor housing. The terminal box includes a pair of troughs formed in a bottom wall thereof and an opening formed through the bottom wall in each trough. Furthermore, the bottom surface of the bottom wall includes a plurality of walls extending therefrom. The walls channel moisture away from the openings in the troughs. An outer wall extends around the plurality of walls and forms a seal with the motor housing.

The motor housing includes a first portion, a second portion, and a mid-frame coupled between the first portion and the second portion. The mid-frame includes an axially-oriented groove formed in its outer periphery. The groove is positioned radially inward of the inner surfaces of the first and second housing portions such that gaps are formed therebetween. The gaps allow any moisture within the motor housing to drainage out, and the axial length of the groove prevents or restricts moisture ingress.

The electric machine also includes a motor assembly including a stator and a rotor positioned within a bore of the stator. The rotor includes a frame and a plurality of magnets coupled within the frame. The frame is formed from a plastic material and incudes a pair of end plates and a plurality of frame members extending between the end plates. Each end plate includes a plurality of integrally formed fins that disturb the air flow around the motor assembly during operation.

The motor assembly also includes an internal fan coupled to a rotating shaft positioned within a cavity of the second compartment. The internal fan is coupled to the rotatable shaft and is positioned adjacent to at least one electrical component within the motor housing and is configured to provide a cooling flow of air to the at least one electrical component. The internal fan includes the pair of clip arms that include a projection that is configured for insertion into corresponding slots formed in the shaft to prevent rotation of the internal fan with respect to the shaft. The at least one electrical component and the internal fan are positioned within the second compartment, and in some embodiments, the internal fan is configured to recirculate air within the second compartment to facilitate cooling the at least one electrical component. In some embodiments, the internal fan is positioned adjacent the mid-frame. In some embodiments, the internal fan at least partially axially overlaps with the mid-frame along the shaft. In some embodiments, the at least one electrical component are positioned within the second compartment adjacent the end frame.

In some embodiments, an exterior fan (such as fan 120) is coupled to the shaft 130 and is positioned opposite the end frame 116 from the at least one electrical component 136. The internal fan 134 and the exterior fan are configured to facilitate cooling the at least one electrical component 136.

A method of assembling an electric machine assembly 100 comprises the steps of extending the rotatable shaft 130 through an inner cavity of a housing, positioning at least one electrical component 136 within the cavity and coupling the internal fan 134 to the shaft 130 within the cavity such that rotation of the internal fan 134 provides a cooling airflow to the at least one electrical component 136. In some embodiments, the method further includes the step of coupling the internal fan 134 to the shaft 130 includes extending the shaft 130 through a central opening of an inner hub 212 of the internal fan 134. In some embodiments, the method further includes the step of coupling the internal fan 134 to the shaft 130 and engaging the clip arm 218 extending from the inner hub 212 of the internal fan 134 with the shaft 130. Engaging the clip arm 218 comprises inserting the projection 220 at the distal end of the clip arm 218 into the slot 22 defined in the shaft 130 to prevent rotation of the internal fan 134 relative to the shaft 130.

In some embodiments, the method further comprises the step of positioning the mid-frame within the cavity to separate the cavity into the first compartment and the second compartment. Positioning the mid-frame within the cavity comprises positioning the mid-frame such that the internal fan is positioned adjacent the mid-frame and at least partially axially overlaps with the mid-frame along the shaft. In some embodiments, the method further comprises the step of coupling the end frame to the housing such that the end frame at least partially defines the second compartment opposite the mid-frame.

The terminal box is reversibly coupled to the motor housing such that it can be removed from the motor housing and reattached in an orientation 180 degrees opposite from its previous orientation.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. An electric machine assembly comprising:

a shaft configured to rotate about an axis;

an end frame coupled about said shaft such that said shaft rotates relative to said end frame, wherein said end frame comprises:

an end surface;

a plurality of pins that extend axially from said end surface; and an extension portion extending axially from said end surface in a direction away from said plurality of pins, said extension portion comprising:

a cooling portion including a plurality of fins extending from said extension portion in a radial direction away from the axis;

a flange portion; and a seating groove positioned radially between said cooling portion and said flange portion;

an O-ring positioned within said seating grove, between said cooling portion and said flange portion, said O-ring wrapped around said cooling portion and said O-ring does not extend circumferentially around said end frame; and a fan coupled to said shaft such that rotation of said shaft causes rotation of said fan to facilitate cooling said plurality of pins.

2. The electric machine assembly of claim 1, wherein said plurality of pins are arranged in a plurality of concentric circles.

3. The electric machine assembly of claim 2, wherein each circle of pins is circumferentially offset from an immediately adjacent circle of pins.

4. The electric machine assembly of claim 1, wherein said plurality of pins are rectangular in shape and oriented radially lengthwise.

5. The electric machine assembly of claim 1, wherein said end frame comprises a second plurality of pins extending from a radial periphery of said end frame.

6. The electric machine assembly of claim 1, wherein said fan comprises:

a hub;

a first plurality of blades extending from said hub; and an outer ring coupled about said first plurality of blades.

7. The electric machine assembly of claim 6, wherein said fan further comprises webbing extending between adjacent blades of the first plurality of blades.

8. The electric machine assembly of claim 6, wherein said fan further comprises a second plurality of blades coupled to said outer ring, wherein said second plurality of blades are spaced from said hub.

9. The electric machine assembly of claim 8, wherein said first plurality of blades and said second plurality of blades extend radially beyond said outer ring.

10. The electric machine assembly of claim 9, wherein said second plurality of blades extends radially inward of said outer ring.

11. The electric machine assembly of claim 1, wherein said plurality of pins form a tortuous airflow path across said end frame.

12. An end frame for an electric machine assembly coupled about a shaft configured to rotate relative to the end frame, wherein said end frame comprises:

an end surface;

a plurality of pins that extend axially from said end surface, wherein said plurality of pins are arranged in a plurality of concentric circles, and wherein each circle of pins is circumferentially offset from an immediately adjacent circle of pins; and an extension portion extending axially from said end surface in a direction away from said plurality of pins and axially toward a housing portion of the electric machine assembly, said extension portion comprising:

a cooling portion including a plurality of fins extending from said extension portion in a radial direction away from said plurality of pins, the plurality of fins extending axially over the cooling portion and axially toward the housing portion;

a flange portion extending axially opposite said plurality of pins; and a seating groove positioned radially between said cooling portion and said flange portion, wherein said seating groove is configured to receive an O-ring, wherein the cooling portion extends circumferentially beyond said seating groove.

13. The end frame of claim 12, wherein said plurality of pins are rectangular in shape and oriented radially lengthwise.

14. The end frame of claim 12, wherein said plurality of pins are tapered to narrow as they extend from said end surface.

15. The end frame of claim 12, further comprising a second plurality of pins extending about at least a portion of a radially outer periphery of the end frame.

16. A method of manufacturing an end frame for use with an electric machine assembly, said method comprising:

forming an end surface;

forming a plurality of pins that extend axially from the end surface, wherein the plurality of pins are arranged in a plurality of concentric circles, and wherein each circle of pins is circumferentially offset from an immediately adjacent circle of pins; and forming an extension portion that extends axially from said end surface in a direction away from said plurality of pins and axially toward a housing portion of the electric machine assembly, the extension portion comprising:

a cooling portion including a plurality of fins that extend from said extension portion in a radial direction away from said plurality of pins, the plurality of fins extending axially over the cooling portion and axially toward the housing portion;

a flange portion extending axially opposite said plurality of pins; and a seating groove positioned radially between said cooling portion and said flange portion, wherein said seating groove is configured to receive an O-ring, and wherein the cooling portion extends circumferentially beyond said seating groove.

17. The method of claim 16, wherein forming the plurality of pins comprises forming a second plurality of pins extending about at least a portion of a radially outer periphery of the end frame.

18. The method of claim 17, wherein forming the plurality of pins comprises forming a plurality of pins that are rectangular in shape, oriented radially lengthwise, and are tapered to narrow as they extend from the end surface.

19. An electric machine assembly comprising:

a shaft configured to rotate about an axis;

an end frame coupled about said shaft such that said shaft rotates relative to said end frame, wherein said end frame comprises:

an end surface; and a plurality of pins that extend axially from said end surface; and a fan coupled to said shaft such that rotation of said shaft causes rotation of said fan to facilitate cooling said plurality of pins, wherein said fan comprises:

a hub;

a first plurality of blades extending from said hub;

an outer ring coupled about said first plurality of blades; and a second plurality of blades coupled to said outer ring, wherein said second plurality of blades are spaced from said hub;

wherein said first plurality of blades and said second plurality of blades extend radially beyond said outer ring, and said second plurality of blades extends radially inward of said outer ring.

20. The electric machine assembly of claim 19, wherein said fan further comprises webbing extending between adjacent blades of said first plurality of blades, and wherein said second plurality of blades are spaced from said webbing.

* * * * *